United States Patent
Lo et al.

(10) Patent No.: US 10,910,496 B2
(45) Date of Patent: Feb. 2, 2021

(54) FINFET DEVICE WITH ASYMMETRICAL DRAIN/SOURCE FEATURE

(71) Applicant: Taiwan Semiconductor Manufacturing Co., Ltd., Hsin-Chu (TW)

(72) Inventors: Wei-Yang Lo, Kaohsiung (TW); Tung-Wen Cheng, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/898,768

(22) Filed: Jun. 11, 2020

(65) Prior Publication Data
US 2020/0303552 A1    Sep. 24, 2020

Related U.S. Application Data

(62) Division of application No. 16/047,556, filed on Jul. 27, 2018, now Pat. No. 10,665,719.

(60) Provisional application No. 62/538,910, filed on Jul. 31, 2017.

(51) Int. Cl.
| H01L 29/78 | (2006.01) |
|---|---|
| H01L 29/66 | (2006.01) |
| H01L 29/08 | (2006.01) |
| H01L 21/8238 | (2006.01) |
| H01L 27/092 | (2006.01) |
| H01L 27/11 | (2006.01) |

(52) U.S. Cl.
CPC .. *H01L 29/7851* (2013.01); *H01L 21/823814* (2013.01); *H01L 27/0924* (2013.01); *H01L 29/0847* (2013.01); *H01L 29/66545* (2013.01); *H01L 29/66636* (2013.01); *H01L 29/66795* (2013.01); *H01L 29/785* (2013.01); *H01L 21/823821* (2013.01); *H01L 27/1104* (2013.01)

(58) Field of Classification Search
CPC .............. H01L 29/7851; H01L 29/785; H01L 27/0924; H01L 29/66795; H01L 29/0847; H01L 29/66545; H01L 21/823814; H01L 21/823821
USPC .......................................... 257/401
See application file for complete search history.

(56) References Cited

U.S. PATENT DOCUMENTS

| 10,665,719 | B2 * | 5/2020 | Lo ..................... H01L 29/66545 |
|---|---|---|---|
| 2016/0111542 | A1 | 4/2016 | Zhang |
| 2016/0315146 | A1 | 10/2016 | Jung |
| 2017/0263722 | A1 | 9/2017 | You |

\* cited by examiner

*Primary Examiner* — Caleen O Sullivan
(74) *Attorney, Agent, or Firm* — Duane Morris LLP

(57) ABSTRACT

A semiconductor device includes a fin-like structure extending along a first axis; a first source/drain feature disposed at a first end portion of the fin-like structure; and a constraint layer disposed at a first side of the first end portion of the fin-like structure, wherein the first source/drain feature comprises a first portion, disposed at the first side, the first portion comprising a shorter extended width along a second axis, and a second portion, disposed at a second side that is opposite to the first side, the second portion comprising a longer extended width along the second axis.

20 Claims, 25 Drawing Sheets

FINFET DEVICE WITH ASYMMETRICAL DRAIN/SOURCE FEATURE

CROSS-REFERENCE TO RELATED APPLICATION

The present application is a divisional application of U.S. patent application Ser. No. 16/047,556, filed Jul. 27, 2018 which claims priority to U.S. Provisional Patent Application No. 62/538,910, filed on Jul. 31, 2017, each of which are incorporated by reference herein in its entirety.

BACKGROUND

Integrated circuits (IC's) typically include a large number of components, particularly transistors. One type of transistor is a metal-oxide-semiconductor field-effect-transistor (MOSFET). MOSFET devices typically include a gate structure on top of a semiconductor substrate. Both sides of the gate structure are doped to form source and drain regions. A channel is formed between the source and drain regions beneath the gate. Based on a voltage bias applied to the gate, electric current may either be allowed to flow through the channel or be inhibited from doing so.

In some cases, the channel may be formed as a fin-like structure (herein "fin"). Such a fin protrudes beyond a top surface of the substrate and runs perpendicular to the gate structure formed on the substrate and the fin. In general, a field-effect-transistor using such a fin as a channel is referred to as a fin field-effect-transistor ("FinFET"). The FinFET further includes source/drain features epitaxially grown from respective side portions of the fin channel. Such a source/drain feature is typically grown to symmetrically extend beyond an original geometric dimension of the fin channel.

As mentioned above, an IC typically includes plural transistors, e.g., FinFET's, formed on a same substrate, or a chip. In accordance with evolution of the technology nodes, the number of FinFET's disposed on a single chip also increases rapidly. As such, the conventional FinFET's source/drain feature with the "symmetrically extended" profile may encounter various issues such as, for example, an undesirable, or intolerable, parasitic capacitance value induced by two neighboring symmetrically extended source/drain features (i.e., two neighboring FinFET's) when the two neighboring FinFET's are disposed substantially close to each other, which becomes more common in advanced technology nodes.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
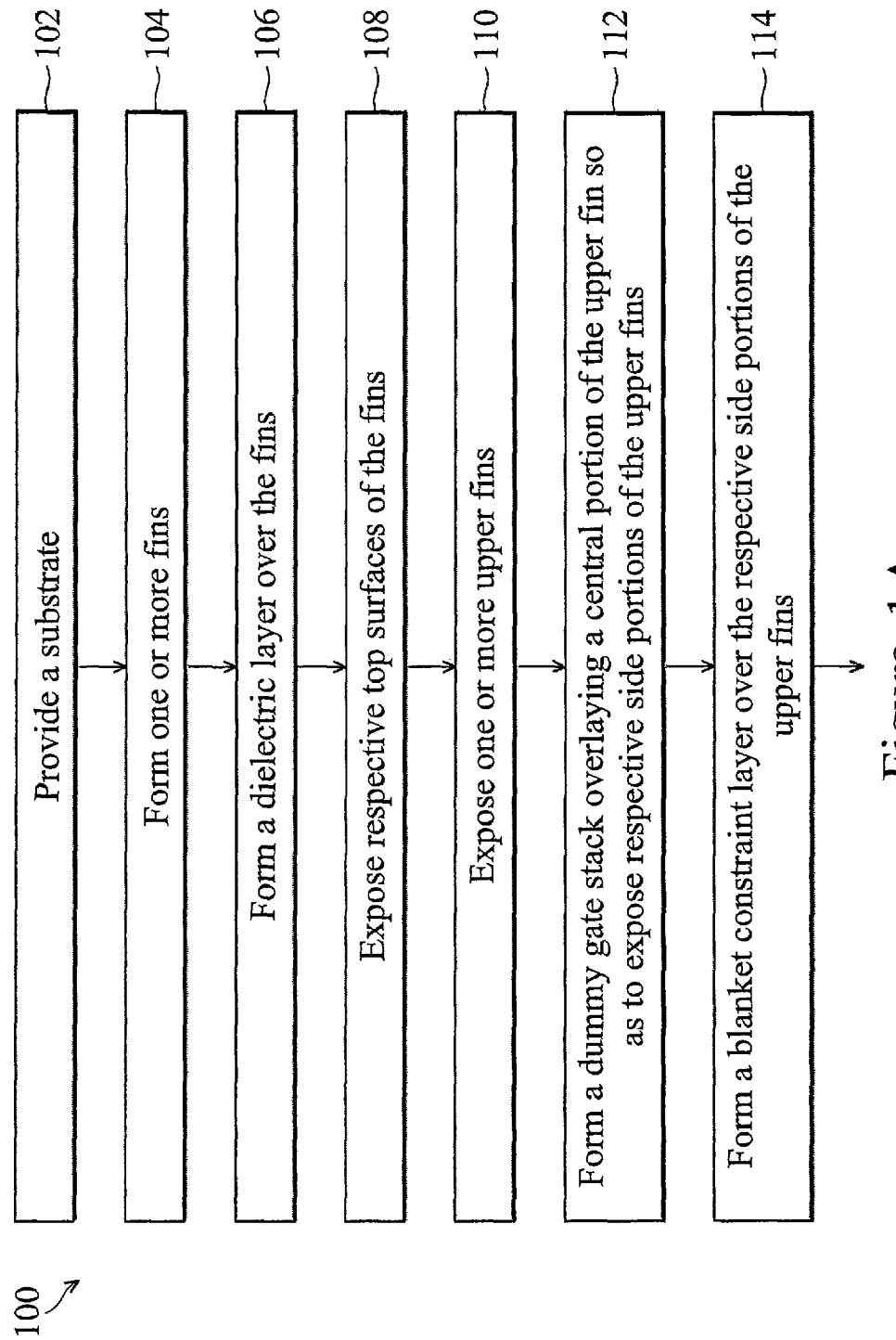
FIGS. 1A and 1B illustrate a flow chart of an embodiment of a method to form a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a fin field-effect-transistor (FinFET) that includes at least an asymmetrical source/drain feature and method of forming the same. In some embodiments, such an asymmetrical source/drain feature tends to epitaxially grow faster (i.e., extending farther) toward a first side that is based on which side a constraint structure is disposed. More specifically, before the growth of the asymmetrical source/drain feature, in some embodiments, a constraint structure is formed at a second side that is opposite to the first side so that the constraint structure can restrict extension of the asymmetrical source/drain feature toward the second side, and allow the asymmetrical source/drain feature to extend farther toward the first side. As such, the asymmetrical source/drain feature can be controlled to grow toward a particular side, which can be a side where components (e.g., source/drain features) are formed more sparsely. Thus, when an IC, which includes plural FinFET's, is to be fabricated on a single substrate, the constraint structure can be selectively formed on any desired side where other components of the IC has been, or will be, densely formed so as to cause a respective asymmetrical source/drain feature to grow toward an opposite side.

Figure 1B:
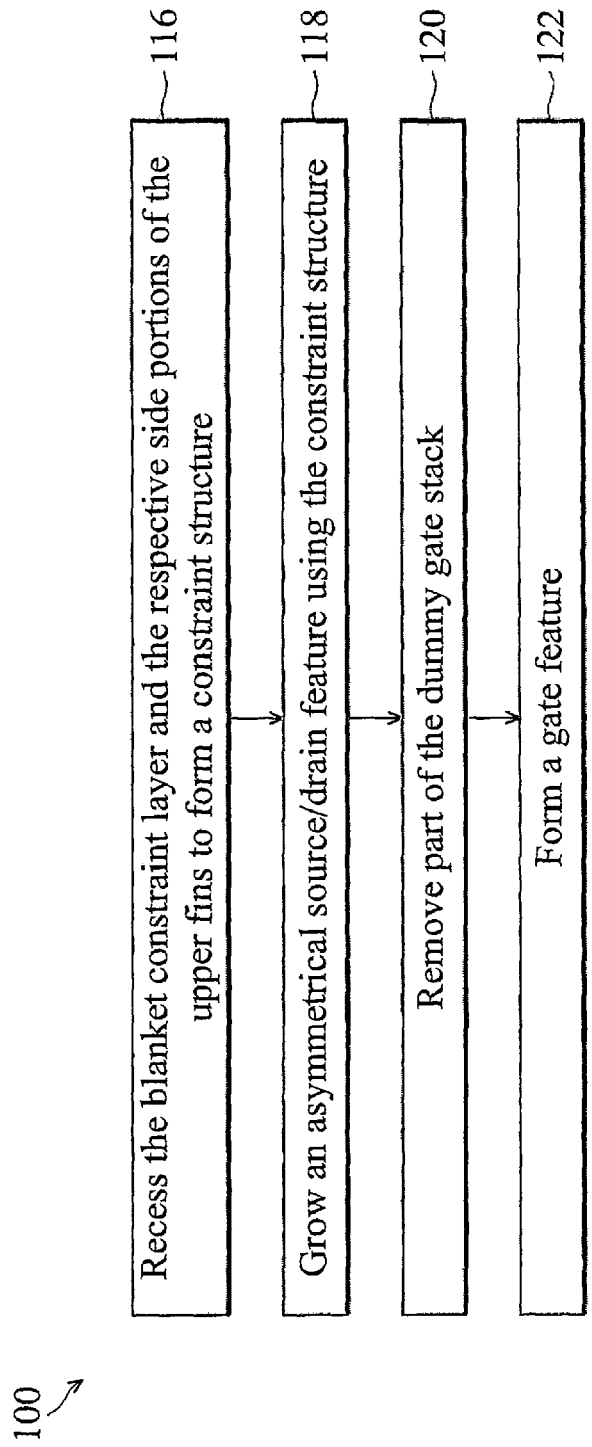

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, a FinFET. As employed by the present disclosure, the FinFET refers to any fin-based, multi-gate transistor. It is noted that the method of FIGS. 1A and 1B does not produce a completed FinFET. A completed FinFET may be fabricated using complementary metal-oxide-semiconductor (CMOS) technology processing. Accordingly, it is understood that additional operations may be provided before, during, and after the method 100 of FIGS. 1A and 1B, and that some other operations may only be briefly described herein.

In some embodiments, the method 100 starts with operation 102 in which a semiconductor substrate is provided. The method 100 continues to operation 104 in which one or more fins are formed extending beyond a major surface of the semiconductor substrate. The method 100 continues to operation 106 in which a dielectric material is deposited over the semiconductor substrate. The method 100 continues to operation 108 in which respective top surfaces of the one or more fins are exposed. The method 100 continues to operation 110 in which an upper fin of each fin is exposed. The method 100 continues to operation 112 in which a dummy gate sack is formed over respective central portions of the upper fins so as expose respective side portions of the upper fins. The method 100 continues to operation 114 in which at least a blanket constraint layer is formed over the respective side portions of the upper fins. The method 100 continues to operation 116 in which the blanket constraint layer and the respective side portions of the upper fins are recessed to form a constraint structure The method 100 continues to operation 118 in which at least an asymmetrical source/drain feature is guided by the constraint structure to grow toward a side where the constraint structure is not formed. The method 100 continues to operation 120 in which at least part of the dummy gate stack is removed (e.g., etched) to expose the respective central portions of the upper fins. The method 100 continues to operation 122 in which a gate feature is formed over the central portion of each upper fin.

In some embodiments, operations of the method 100 may be associated with perspective views of a semiconductor device 200 at various fabrication stages as shown in FIGS. 2A, 3A, 4A, 5A, 6A, 7A, 8A, 9A, 10A, 11A, and 12A, respectively, and corresponding cross-sectional views as shown in FIGS. 2B, 3B, 4B, 5B, 6B, 7B, 8B, 9B, 10B, 11B, and 12B. In some embodiments, the semiconductor device 200 may be a FinFET. The FinFET 200 may be included in a microprocessor, memory cell, and/or other integrated circuit (IC). Also, FIGS. 2A through 12B are simplified for a better understanding of the concepts of the present disclosure. For example, although the figures illustrate the FinFET 200, it is understood the IC may comprise a number of other devices comprising resistors, capacitors, inductors, fuses, etc., which are not shown in FIGS. 2A through 12B, for purposes of clarity of illustration.

Figure 2A:
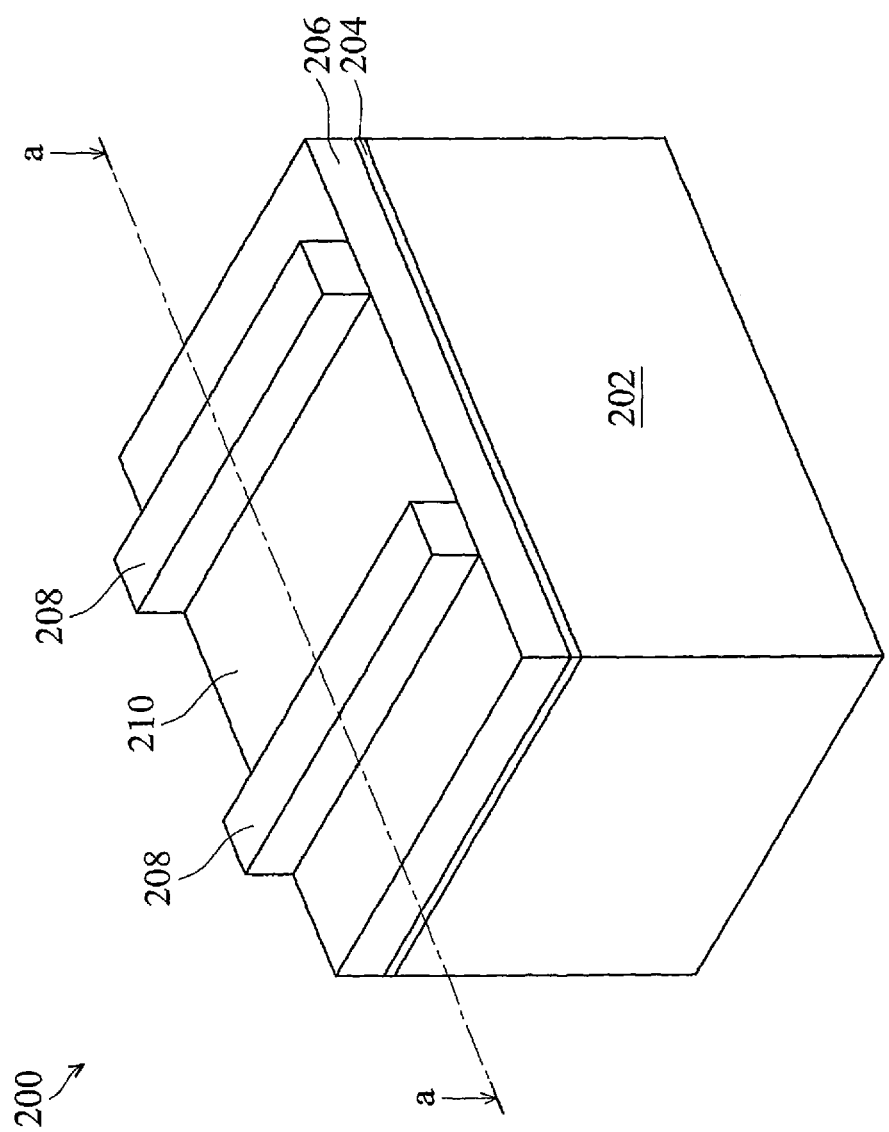
FIGS. 2A, 3A, 4A, 5A, 6A, 7A, 8A, 9A, 10A, 11A, and 12A illustrate perspective views of an exemplary semiconductor device, made by the method of FIGS. 1A-1B, during various fabrication stages, in accordance with some embodiments.
Figure 2B:
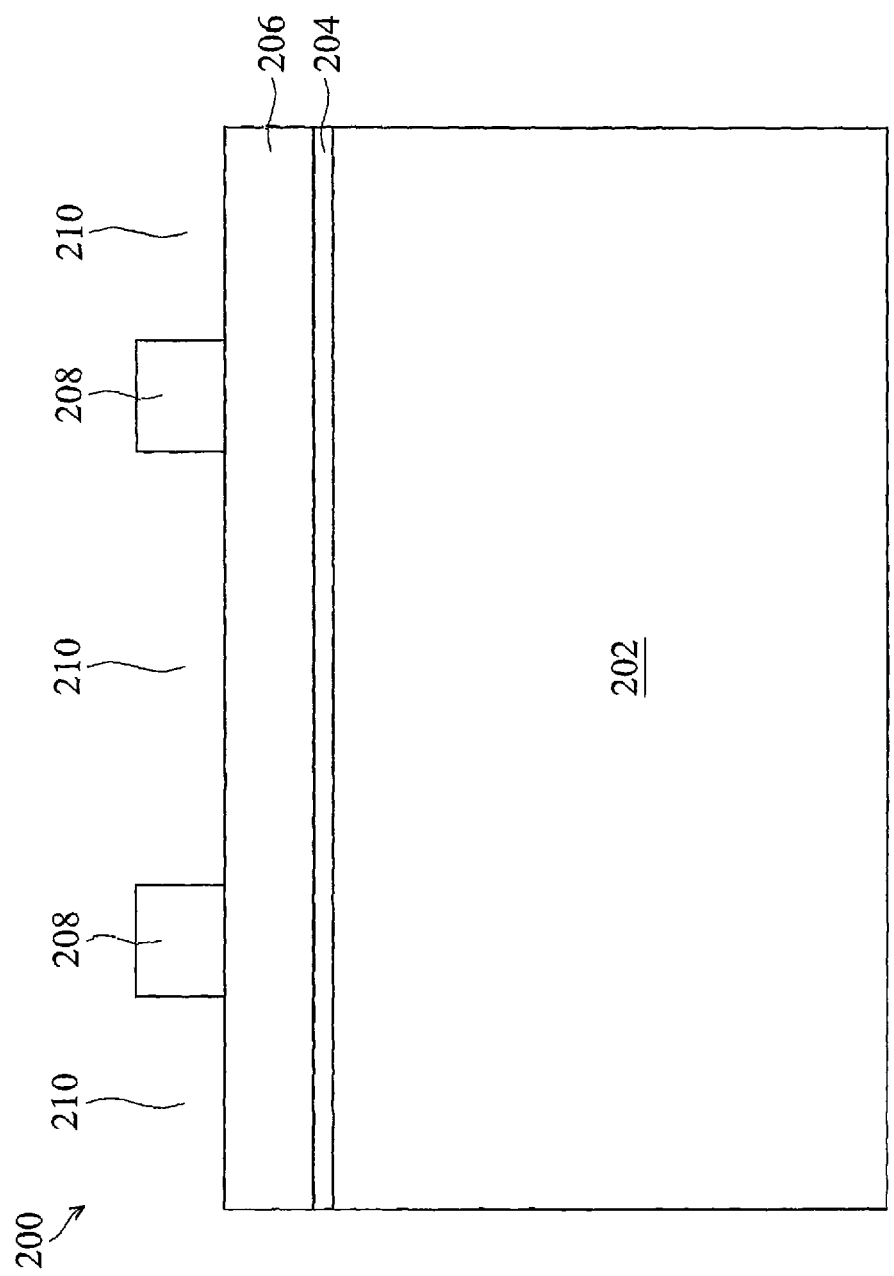
FIGS. 2B, 3B, 4B, 5B, 6B, 7B, 8B, 9B, 10B, 11B, and 12B illustrate corresponding cross-sectional views of FIGS. 2A, 3A, 4A, 5A, 6A, 7A, 8A, 9A, 10A, 11A, and 12A, in accordance with some embodiments.

Corresponding to operation 102 of FIG. 1A, FIG. 2A is a perspective view of the FinFET 200 including a substrate 202 at one of the various stages of fabrication, according to some embodiments, and FIG. 2B is a cross-sectional view of the FinFET 200 taken along line a-a of FIG. 2A. As shown, the substrate 202 is covered by a pad layer 204, a mask layer 206, and a photo-sensitive layer 208 that is patterned with one or more openings 210. The photo-sensitive layer 208 is patterned to form fin(s) of the FinFET 200, which will be discussed in the following operations.

In some embodiments, the substrate 202 comprises a crystalline silicon substrate (e.g., wafer). In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In some embodiments, the pad layer 204 may be a thin film comprising silicon oxide formed, for example, using a thermal oxidation process. The pad layer 204 may act as an adhesion layer between the semiconductor substrate 202 and the mask layer 206. The pad layer 204 may also act as an etch stop layer while etching the mask layer 206. In some embodiments, the mask layer 206 is formed of silicon nitride, for example, using low-pressure chemical vapor deposition (LPCVD) or plasma enhanced chemical vapor deposition (PECVD). The mask layer 206 is used as a hard mask during subsequent photolithography processes. The photo-sensitive layer 208 is formed on the mask layer 206, and then patterned thereby forming the openings 210 in the photo-sensitive layer 208.

Figure 3A:
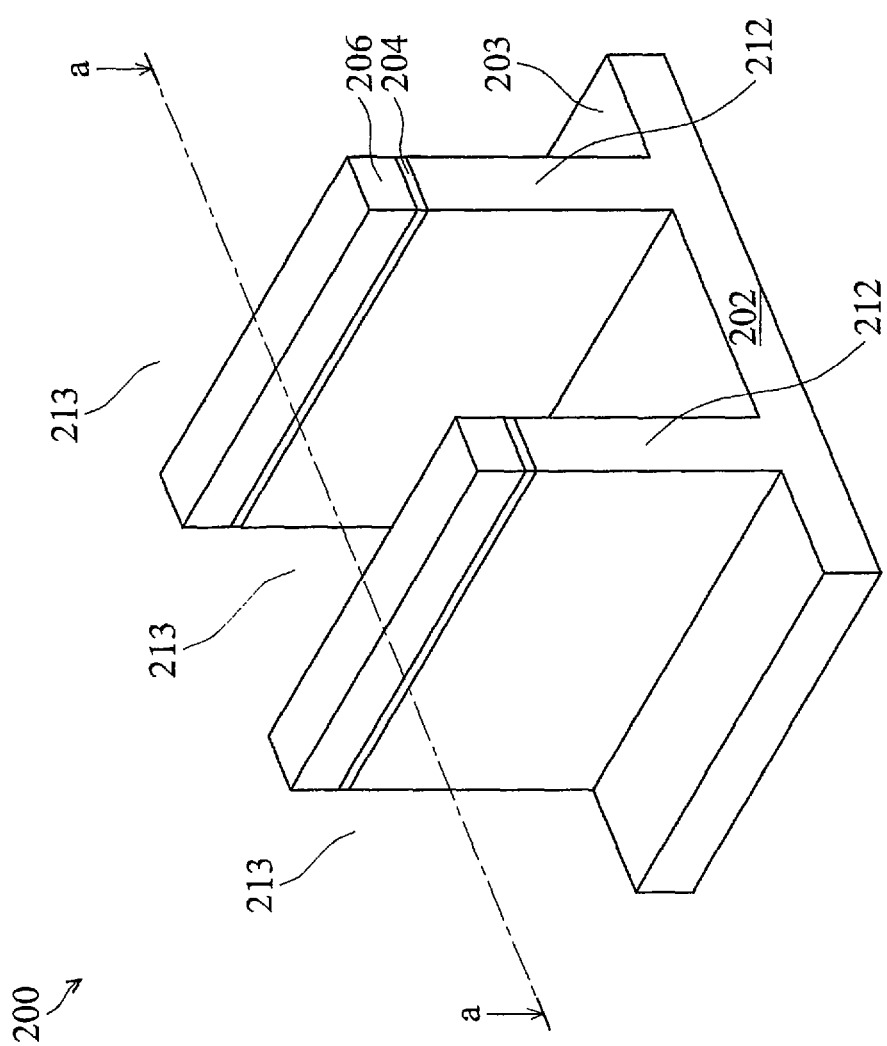
Figure 3B:
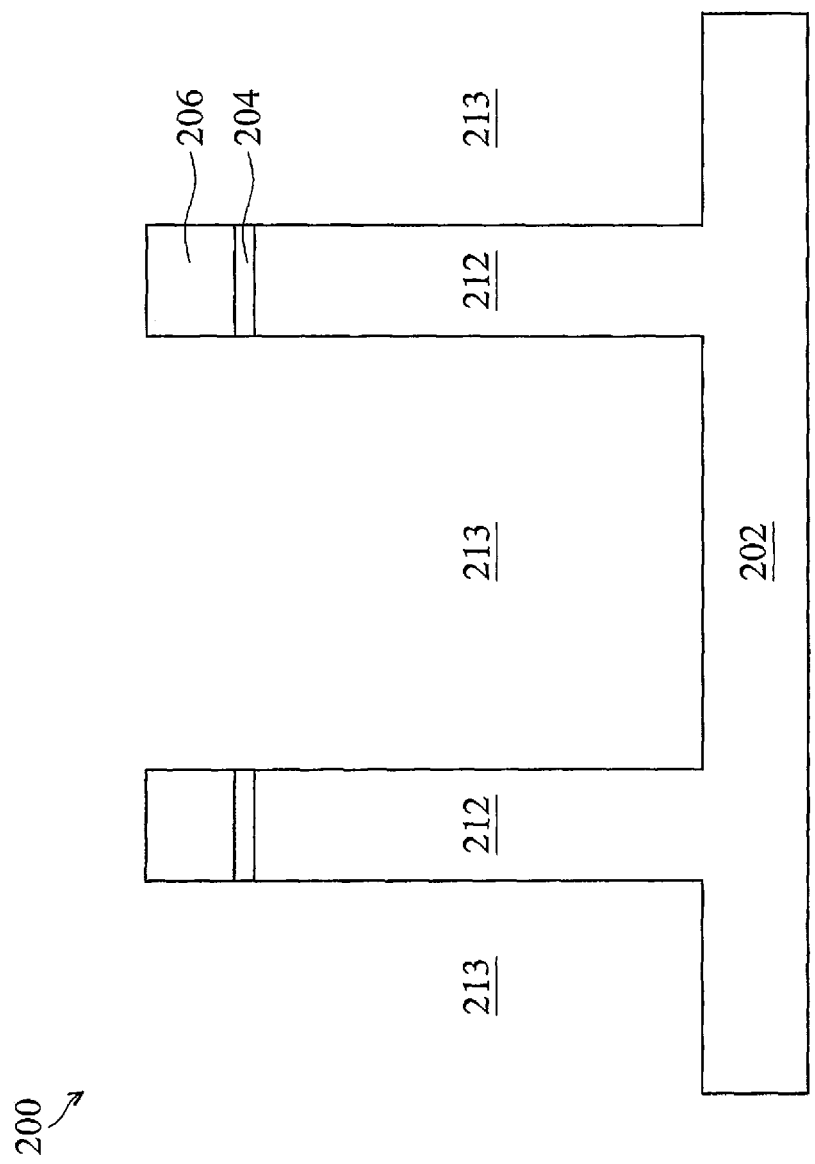

Corresponding to operation 104 of FIG. 1A, FIG. 3A is a perspective view of the FinFET 200 including one or more fins 212 at one of the various stages of fabrication, according to some embodiments, and FIG. 3B is a cross-sectional view of the FinFET 200 taken along line a-a of FIG. 3A. As shown, the neighboring fins 212 are spaced by a central trench 213. It is noted that although only two fins 212 are shown in the illustrated embodiments of FIGS. 3A and 3B (and the following figures), any desired number of fins may be formed on the semiconductor substrate 202 using the photo-sensitive layer 208 (FIGS. 2A and 2B) with a corresponding pattern. Thus, the left and right trenches 213 in FIGS. 3A and 3B may be respectively coupled between one of the shown fins 212, and another non-shown fin.

In some embodiments, the fins 212 are formed by at least some of the following processes. The mask layer 206 and pad layer 204 are etched through openings 210 (FIGS. 2A and 2B) to expose underlying semiconductor substrate 202. By using remaining pad layer 204 and the mask layer 206, as shown in FIGS. 3A and 3B, the exposed semiconductor substrate 202 is then etched to form the trenches 213 so as to cause a major surface 203 of the semiconductor substrate 202 to be exposed. Portions of the semiconductor substrate 202 sandwiched between the trenches 213 are thus formed as the fins 212. The fins 212 each extends upward from the major surface 203. The trenches 213 may be strips (viewed from the top of the FinFET 200) parallel to each other, and closely spaced with respect to each other. After the fins 212 are formed, the photo-sensitive layer 208 (not shown in FIGS. 3A and 3B for purposes of clarity) is removed. Subsequently, a cleaning process may be performed to remove a native oxide of the semiconductor substrate 202. The cleaning may be performed using diluted hydrofluoric (DHF) acid, or the like.

Figure 4A:
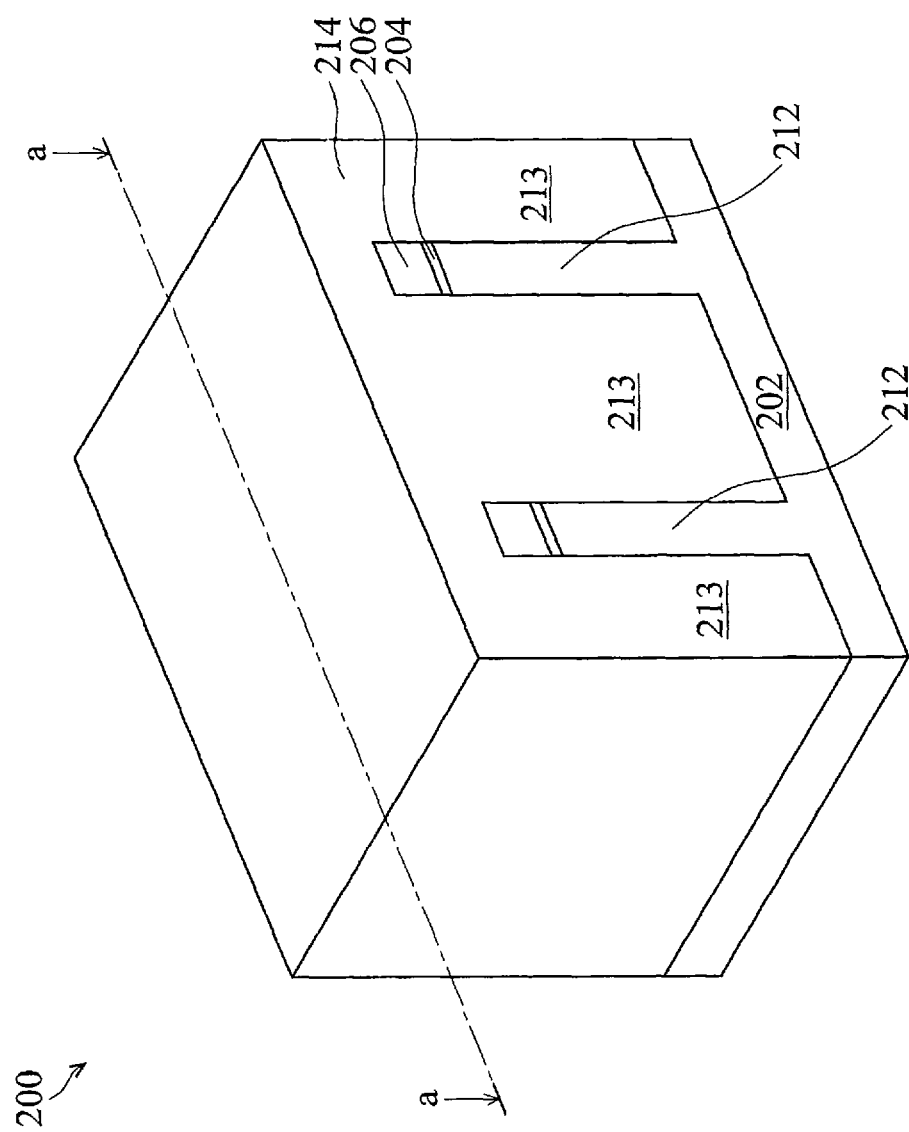
Figure 4B:
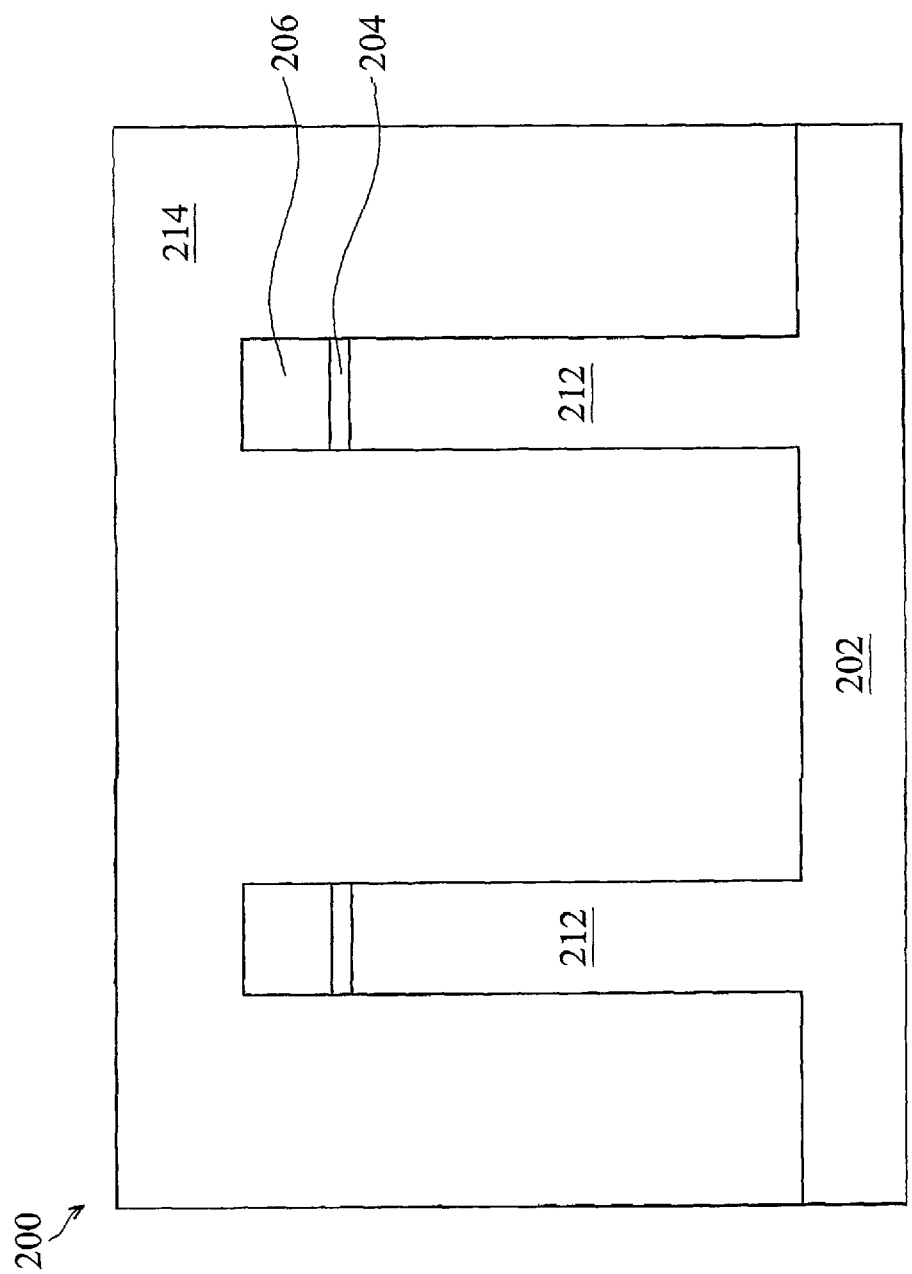

Corresponding to operation 106 of FIG. 1A, FIG. 4A is a perspective view of the FinFET 200 including a dielectric material 214 formed over the substrate 202, the fins 212, the pad layer 204, and the mask layer 206 at one of the various stages of fabrication, according to some embodiments, and FIG. 4B is a cross-sectional view of the FinFET 200 taken along line a-a of FIG. 4A. As shown, the dielectric material 214 is formed over the whole FinFET 200 such that the entire trenches 213 are filled by the dielectric material 214.

In an embodiment, the dielectric material 214 may be deposited over the substrate 202 using a high-density-plasma (HDP) CVD process with reacting precursors, e.g., silane (SiH$_4$) and oxygen (O$_2$). In another embodiment, the dielectric material 214 may be deposited over the substrate 202 using a sub-atmospheric CVD (SACVD) process or a high aspect-ratio process (HARP), wherein process gases used in such processes may comprise tetraethylorthosilicate (TEOS) and ozone (O$_3$). In yet another embodiment, the dielectric material 214 may be deposited over the substrate 202 using a spin-on-dielectric (SOD) process such as, for example, hydrogen silsesquioxane (HSQ), methyl silsesquioxane (MSQ), or the like.

Figure 5A:
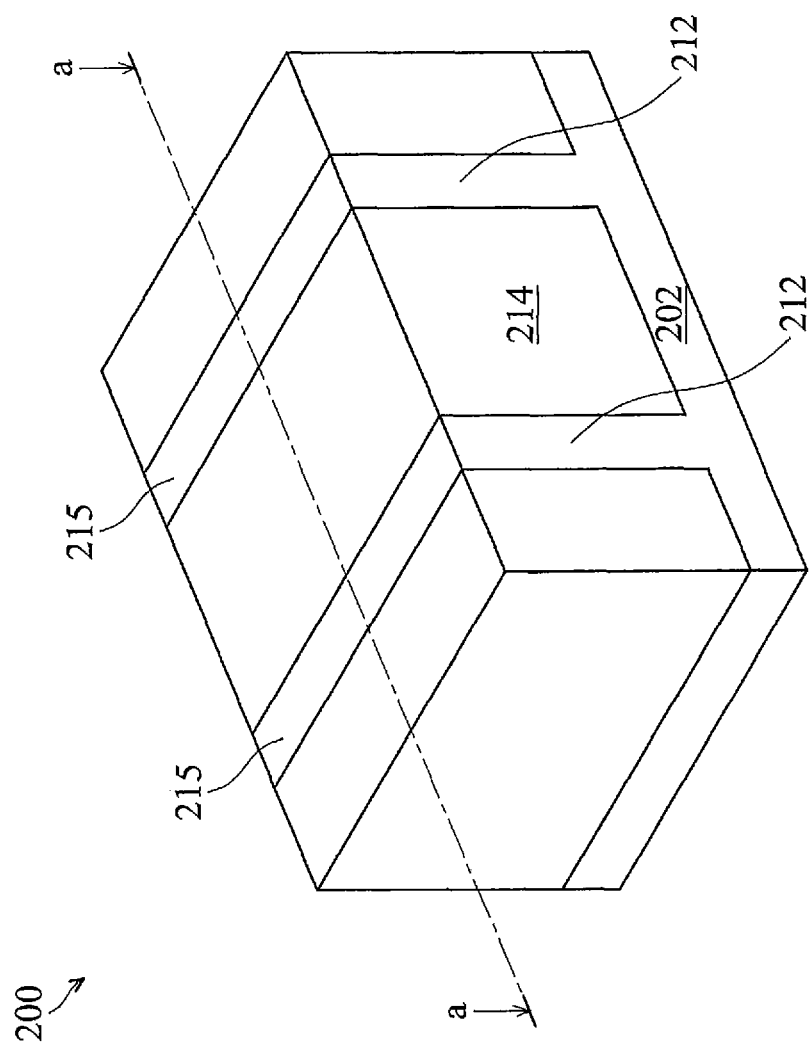
Figure 5B:
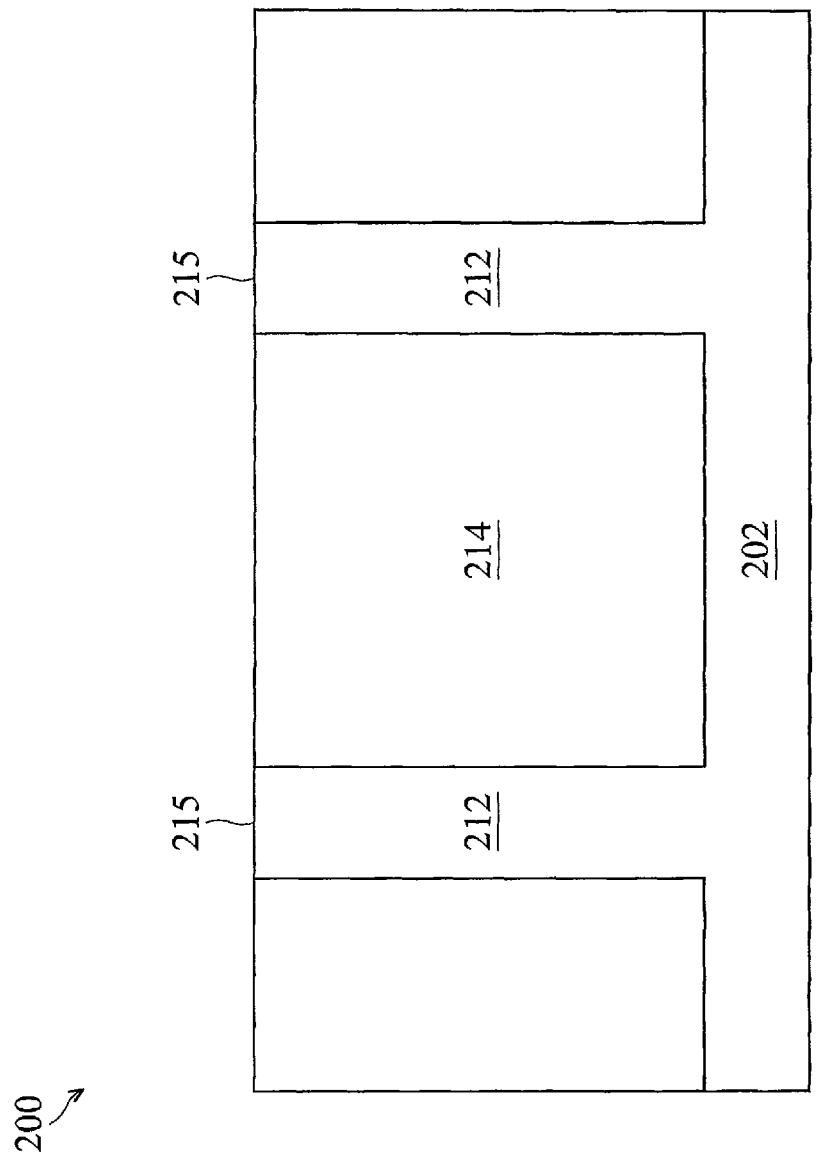

Corresponding to operation 108 of FIG. 1A, FIG. 5A is a perspective view of the FinFET 200 including top surfaces 215 of the fins 212 which are exposed at one of the various stages of fabrication, according to some embodiments, and FIG. 5B is a cross-sectional view of the FinFET 200 taken along line a-a of FIG. 5A. In some embodiments, the top surface 215 is exposed by performing a polishing process (e.g., a chemical-mechanical polishing process) on the dielectric material 214 (FIGS. 4A and 4B) until the mask layer 206 is again exposed. The mask layer 206 and the pad layer 204 are then removed to expose the top surface 215. In some embodiments, when the mask layer 206 is formed of silicon nitride, the mask layer 206 may be removed using a wet process using hot phosphoric acid (H$_3$PO$_4$), and when the pad layer 204 is formed of silicon oxide, the pad layer 204 may be removed using diluted hydrofluoric acid (HF). In some alternative embodiments, the removal of the mask layer 206 and the pad layer 204 may be performed after a recession process performed on the dielectric material 214, which will be discussed in FIGS. 6A and 6B as follows.

Figure 6A:
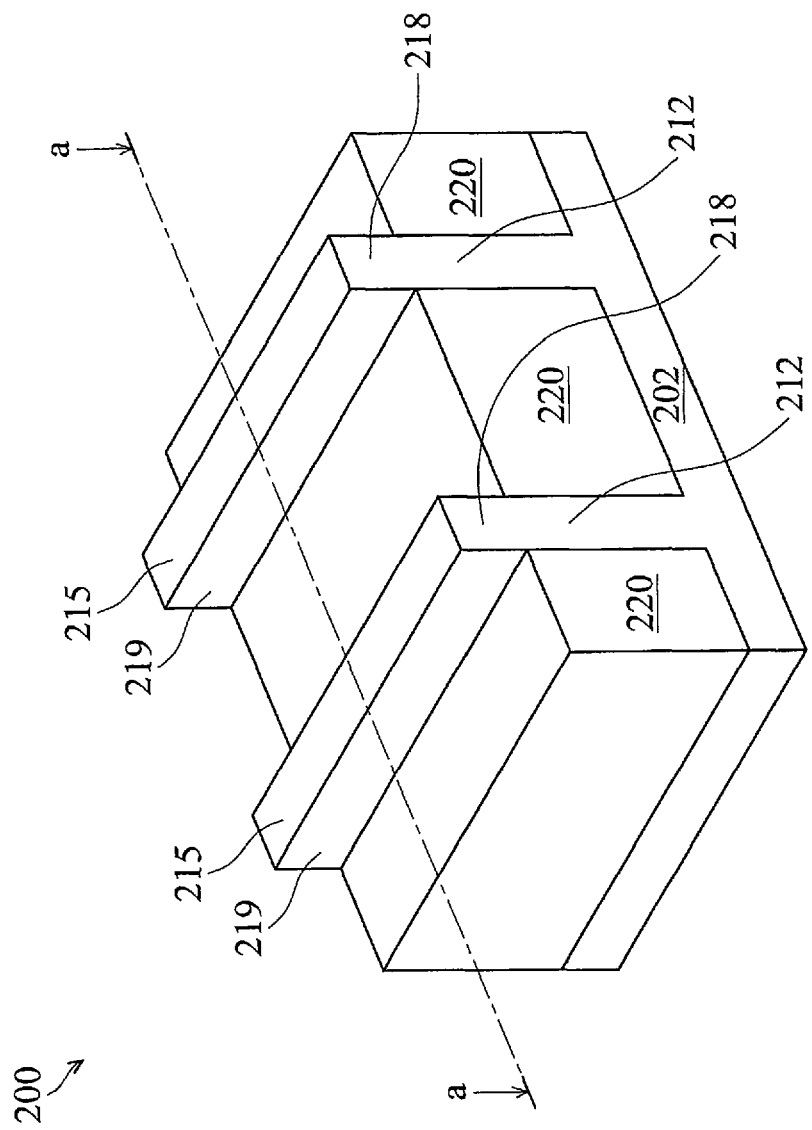
Figure 6B:
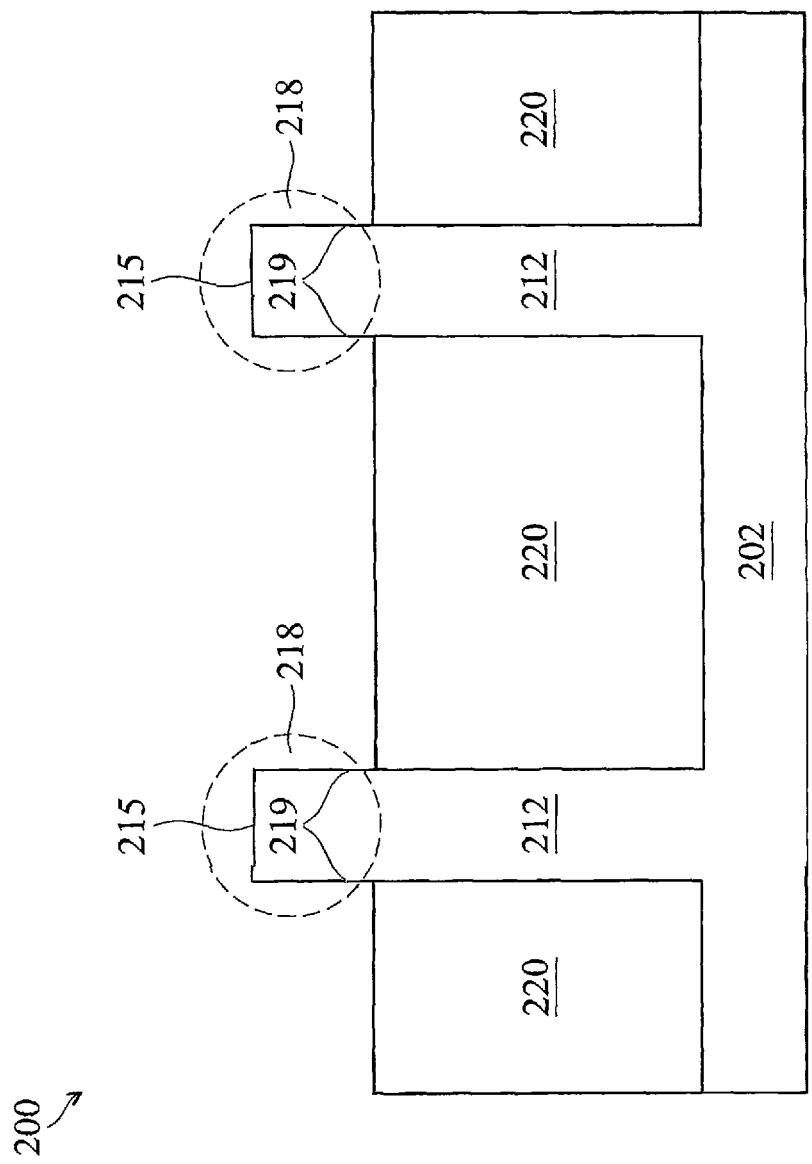

Corresponding to operation 110 of FIG. 1A, FIG. 6A is a perspective view of the FinFET 200 including respective upper fins 218 of the fins 212, which are exposed at one of the various stages of fabrication, according to some embodiments, and FIG. 6B is a cross-sectional view of the FinFET 200 taken along line a-a of FIG. 6A. As shown, an isolation feature 220 is formed between respective lower portions of the neighboring fins 212 so as to expose the respective upper fins 218. In some embodiments, after the upper fins 218 are exposed, sidewalls 219 of the upper fins 218 are exposed together with the respective top surfaces 215.

In some embodiments, the isolation feature 220 may be formed by performing at least one etching process to recess an upper portion of the dielectric material 214 (FIGS. 5A and 5B). In an embodiment, the etching process may include performing a wet etching process such as, for example, dipping the substrate 202 in a hydrofluoric acid (HF) solution to recess the upper portion of the dielectric material 214 until the upper fins 218 are respectively exposed. In another embodiment, the etching process may include performing a dry etching process such as, for example, using etching gases fluoroform (CHF$_3$) and/or boron trifluoride (BF$_3$) to recess the upper portion of the dielectric material 214 until the upper fins 218 are respectively exposed.

Figure 7A:
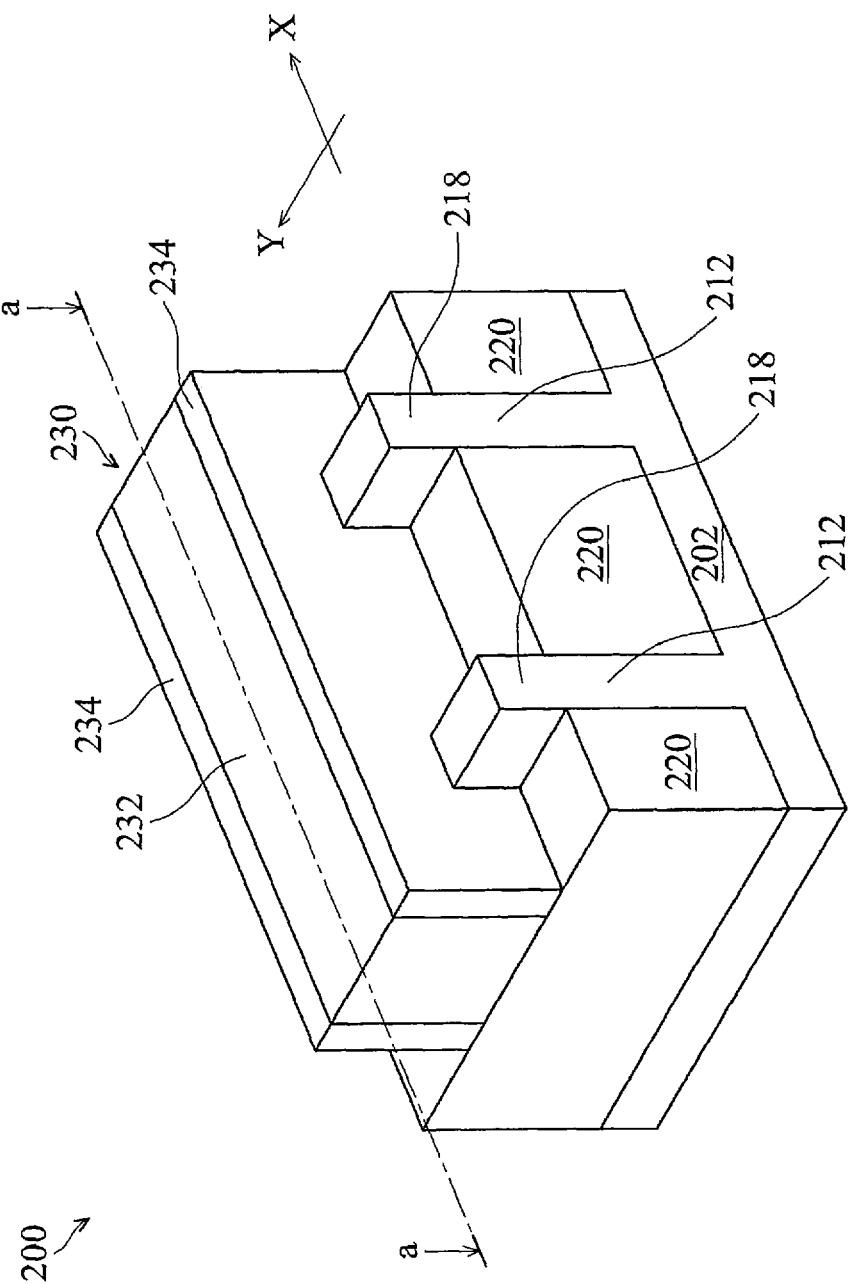
Figure 7B:
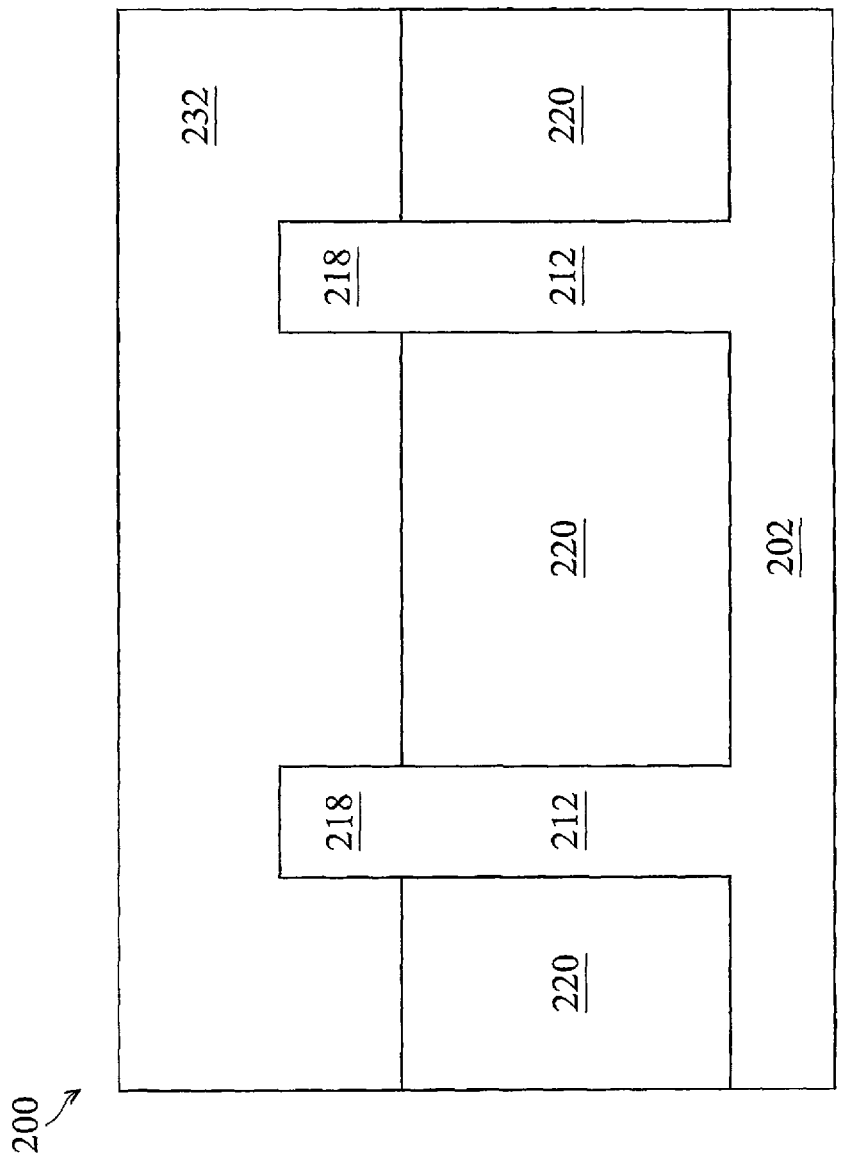

Corresponding to the operation 112 of FIG. 1A, FIG. 7A is a perspective view of the FinFET 200 including a dummy gate stack 230 extending along the X axis so as to overlay the upper fins 218, and the Y axis so as to overlay respective central portions of the upper fins 218 at one of the various stages of fabrication, according to some embodiments, and FIG. 7B is a cross-sectional view of the FinFET 200 taken along line a-a of FIG. 7A. In some embodiments, the central portion of the upper fin 218, overlaid by the dummy gate stack 230, may serve as a conduction channel (along the Y axis) of the FinFET 200.

In some embodiments, the dummy gate stack 230 includes a dummy gate electrode 232, which will be removed in a later removal (e.g., etching) process, and spacer layers 234 extending along sidewalls of the dummy gate electrode 232. In some embodiments, the dummy gate electrode 232 may comprise a polysilicon material. Further, the dummy gate electrode 232 may be a polysilicon material doped with a uniform or non-uniform doping concentration. The dummy gate electrode 232 may be formed using a suitable process such as atomic layer deposition (ALD), chemical vapor deposition (CVD), physical vapor deposition (PVD), plating, or combinations thereof.

In some embodiments, the spacer layer 234 may include silicon oxide (SiO), silicon nitride (SiN), silicon oxynitride (SiON), or other suitable material. The spacer layer 234 may comprise a single layer or multilayer structure. In some embodiments, the spacer layer 234 may be formed by depositing a blanket layer of the spacer layer 234 by CVD, PVD, ALD, or other suitable technique, and performing an anisotropic etching process on the blanket layer to form the pair of the spacer layer 234 along the sidewalls of the dummy gate electrode 232, as shown in the illustrated embodiment of FIG. 7A.

Figure 8A:
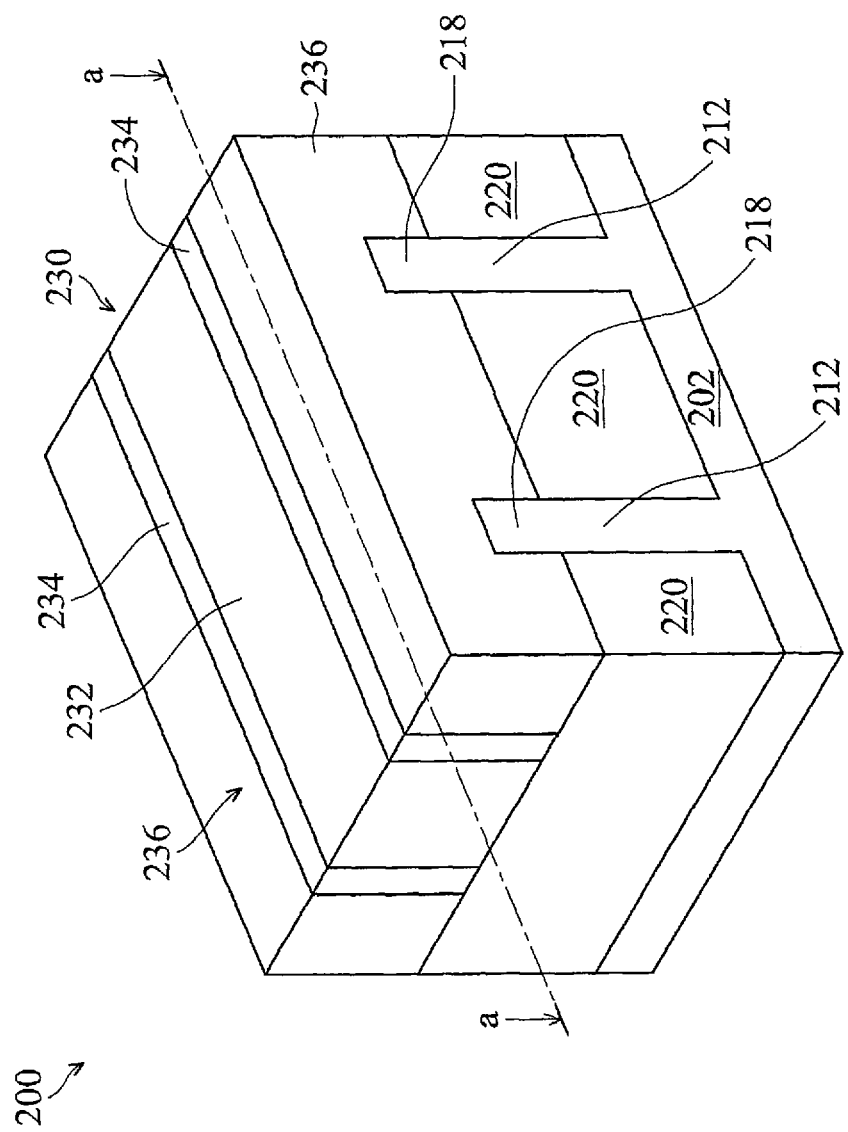
Figure 8B:
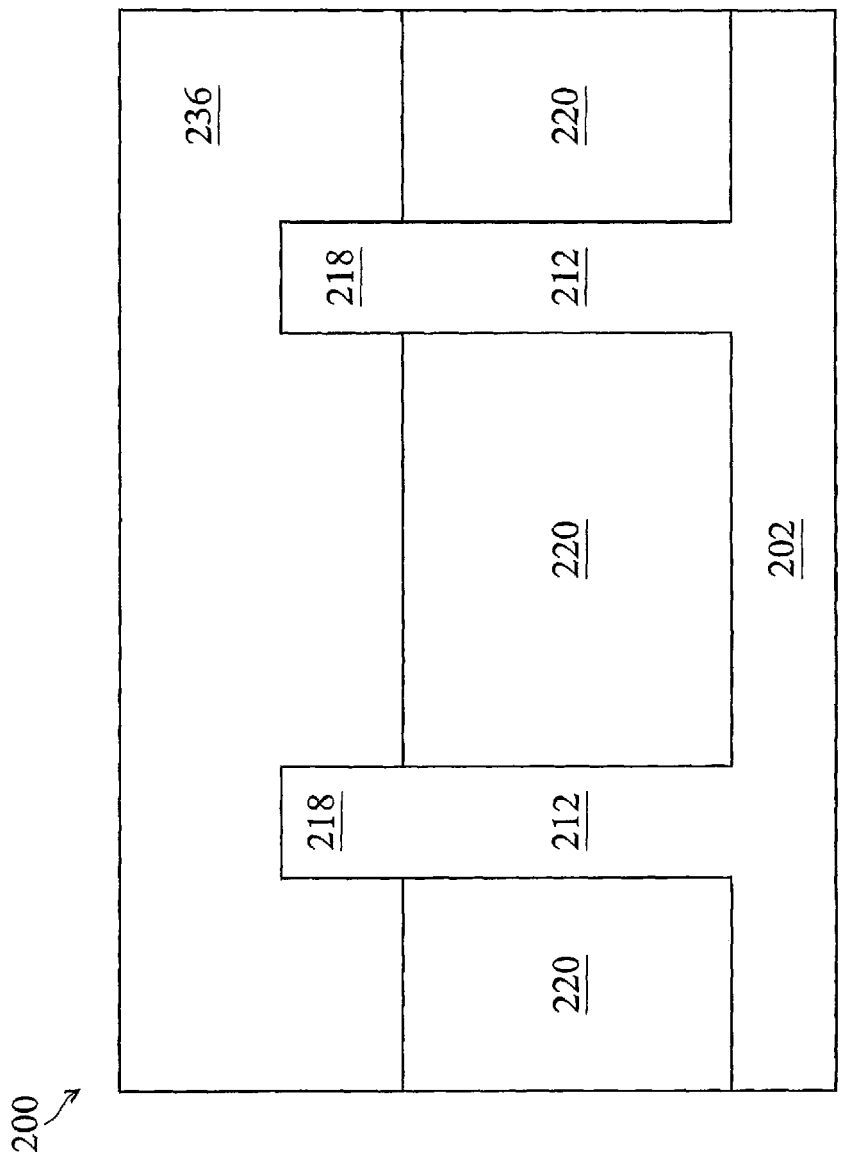

Corresponding to the operation 114 of FIG. 1A, FIG. 8A is a perspective view of the FinFET 200 including a blanket constraint layer 236 at one of the various stages of fabrication, according to some embodiments, and FIG. 8B is a cross-sectional view of the FinFET 200 taken along line a-a of FIG. 8A. As shown in the illustrated embodiments of FIGS. 8A and 8B, the blanket constraint layer 236 is formed over respective side portions (i.e., the portions that are not covered by the dummy gate stack 230) of the upper fins 218. In some embodiments, the blanket constraint layer 236 is deposited over the dummy gate electrode 232.

In some embodiments, the blanket constraint layer 236 is formed of silicon nitride (SiN), and/or other suitable dielectric materials, for example, silicon oxynitride (SiON), silicon carbide (SiC), etc. In some embodiments, the blanket constraint layer 236 may be formed on the isolation feature 220 and further over the respective side portions of the upper fins 218 using a low-pressure chemical vapor deposition (LPCVD) technique, a plasma enhanced chemical vapor deposition (PECVD) technique, or the like.

Figure 9A:
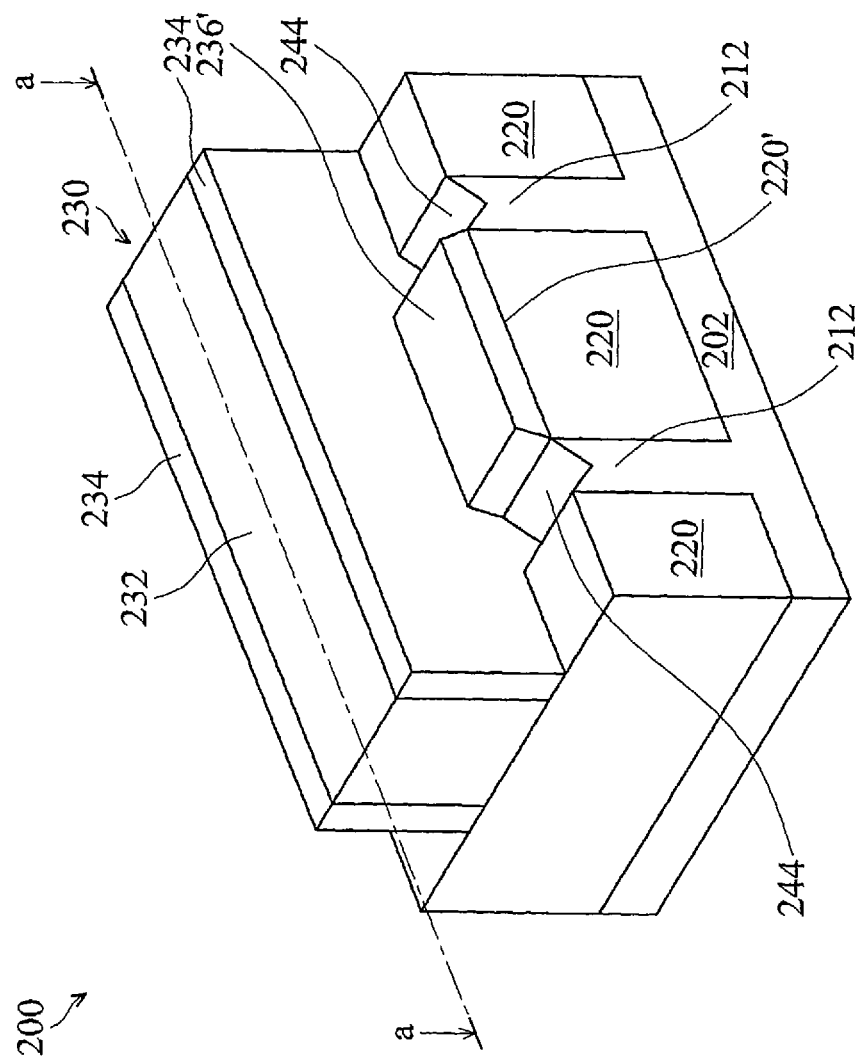
Figure 9B:
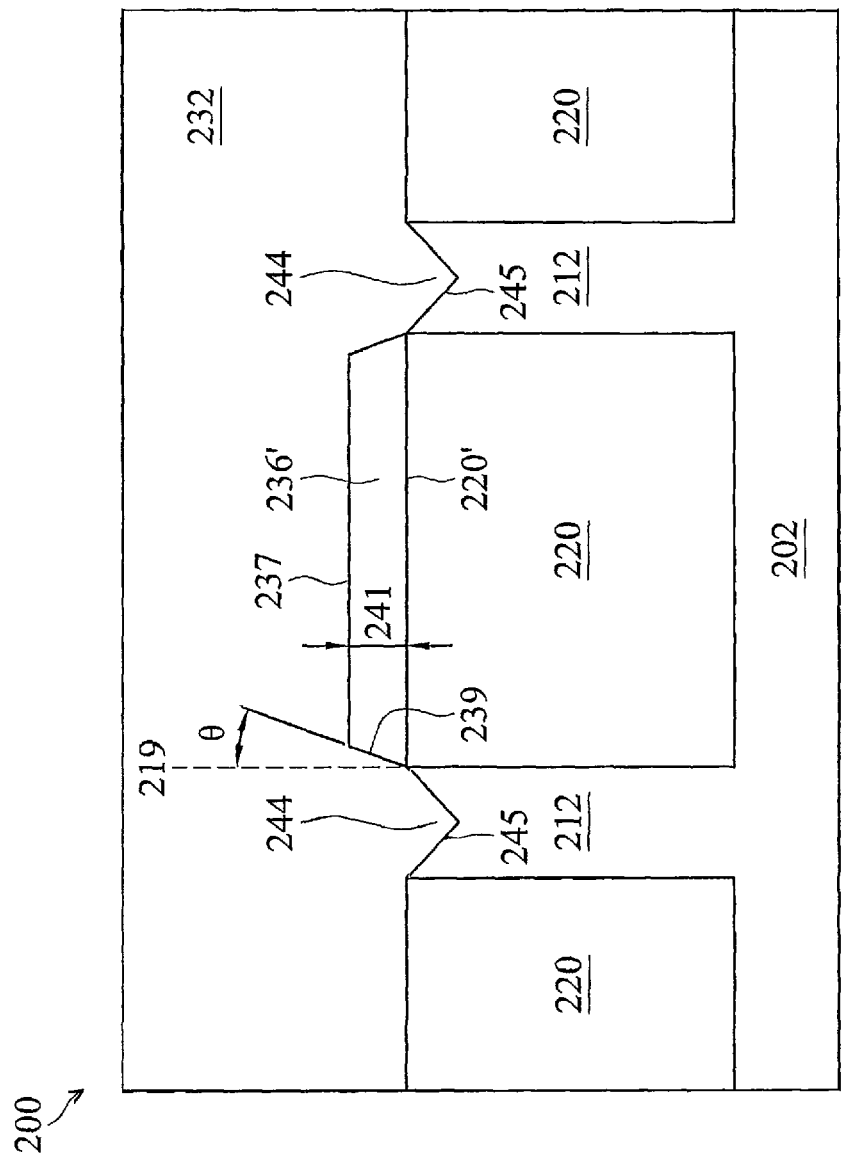

Corresponding to the operation 116 of FIG. 1A, FIG. 9A is a perspective view of the FinFET 200 including a (shaped) constraint layer, hereinafter constraint structure 236', and recesses 244 in the fins 212 at one of the various stages of fabrication, according to some embodiments, and FIG. 9B is a cross-sectional view of the FinFET 200 taken along line a-a of FIG. 9A. In some embodiments, such a constraint structure 236' is formed at either side of each of the fins 212 so as to cause a later grown source/drain to grow "asymmetrically" toward an opposite side, which will be discussed in further detail below with respect to FIGS. 10A and 10B. As shown, the constraint structure 236' is formed at respective right side of the fin 212 at the left (left fin 212), and at respective left side of the fin 212 at the right (right fin 212); and the respective side portions of the upper fin 218 (FIGS. 8A and 8B) that are not covered by the dummy gate stack 230 are removed, and respective upper portions of the fins 212 are further removed so as to form the recesses 244.

In some embodiments, the constraint structure 236' may be formed as a mesa-like structure. More specifically, as shown in FIG. 9B, the mesa-like constraint structure 236' includes an elevated top surface 237 coupled by tilted sidewalls 239. Such a sidewall 239 may be tiled from the sidewall 219 of the upper fin 218 (also a projection of a sidewall of the fin 212) by an angle θ. For example, the angle θ may range between about 15° to about 40° to provide different guidance for the growth of the source/drain feature. In some embodiments, the smaller the angle of the source/drain feature may be guided to grow to have more "asymmetry," which will be discussed in further detail below. In some cases, a greater angle results in insufficient degree of asymmetry. Moreover, in some embodiments, the constraint structure 236' may have a maximum height 241 of about 5 nanometers (nm) to 20 nm to reach an optimal growth result of the source/drain feature. For example, with a constraint structure 236' having such a height, the source/drain feature can be grown with the above-described angle. A greater height increases a subsequent contact feature manufacturing, in some instances. A smaller height results in insufficient degree of asymmetry, in some instances. In some alternative embodiments, the sidewall 239 may be substantially vertical, i.e., the angle θ may be substantially close to zero.

In some embodiments, the recess 244 has a bottom surface 245 that extends downwardly below a top surface 220' of the isolation feature 220, i.e., the bottom surface 245 is vertically lower than the top surface 220'. In some alternative embodiments, the bottom surface 245 of the recess 244 may be formed vertically above the top surface 220'. In some embodiments, the constraint structure 236' and recess 244 may be concurrently formed by performing one or more selective wet/dry etching processes on the blanket constraint layer 236 and the side portions of the upper fins 218 (FIGS. 8A and 8B) until the "mesa-like" constraint structure 236' and the recess 244 in the fin 212 are respectively formed.

Figure 10A:
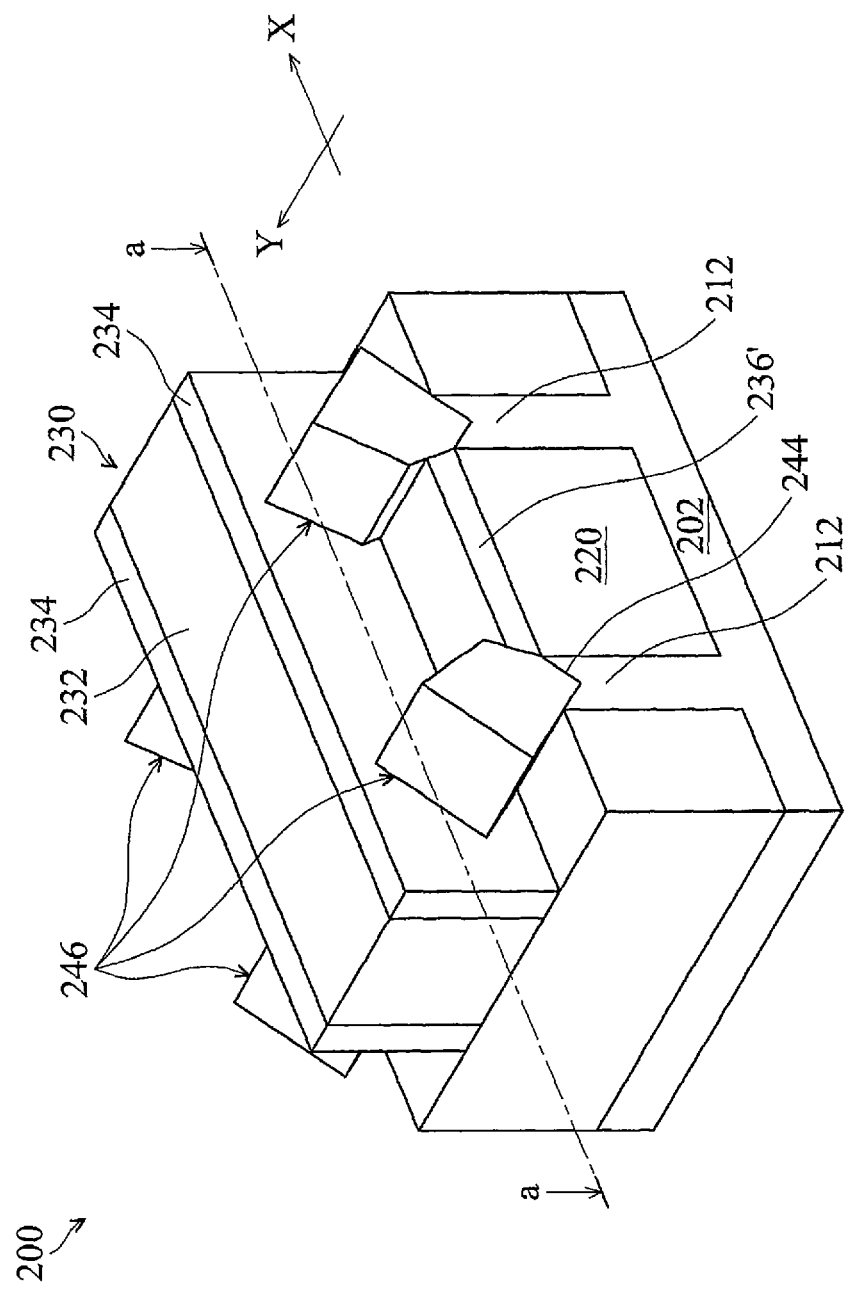
Figure 10:
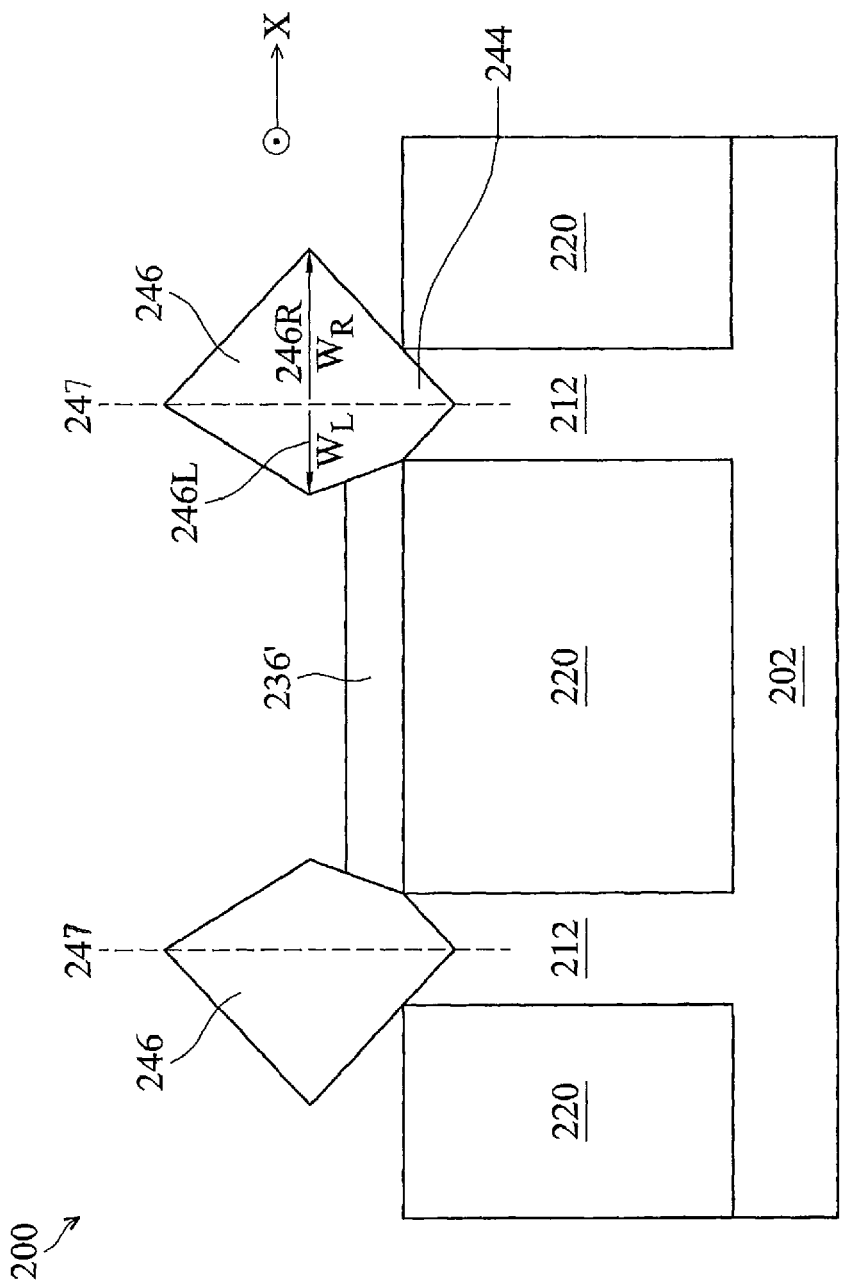

Corresponding to the operation 118 of FIG. 1A, FIG. 10A is a perspective view of the FinFET 200 including asymmetrical source/drain features 246, which are formed at one of the various stages of fabrication, according to some embodiments, and FIG. 10B is a cross-sectional view of the FinFET 200 taken along line a-a of FIG. 10A. It is noted the line a-a of FIG. 10A is not taken across the dummy gate stack 230, but across the asymmetrical source/drain features 246. As shown in the illustrated embodiment of FIG. 10B, the asymmetrical source/drain features 246 is formed to have a left portion 246L and a right portion 246R with respect to a symbolic axis 247, wherein such two portions 246L and 246R have two substantially different geometric dimensions, which will be discussed in further detail below.

As mentioned above, the asymmetrical source/drain feature 246 is epitaxially grown from the recess 244 in the fin 212, and, in some embodiments, the constraint structure 236' is configured to "guide" the epitaxial growth of the asymmetrical source/drain feature 246. More specifically, since the constraint structure 236' is disposed at one side of the upper fin 218 (which becomes one side of the recess 244), the asymmetrical source/drain feature 246 may be substantially constrained to grow at the side where the constraint structure 236' is formed and tend to grow toward the opposite side, in accordance with some embodiments. As such, in the example shown in FIG. 10B, the left portion 246L (i.e., the side where the constraint structure 236' is disposed) has a shorter extended width $W_L$ (along the X axis), and the right portion 246R (i.e., the opposite side to where the constraint structure 236' is disposed) has a longer extended width $W_R$ (along the X axis). In some embodiments, a ratio of the shorter extended width $W_L$ to the longer extended width $W_R$ may vary between about 65% to about 95% to accommodate different device performance. For example, a smaller ratio may represent a more asymmetric source/drain, which may advantageously reduce a corresponding parasitic capacitance, if any. As mentioned above, the channel direction may be along the Y axis, which points either in or out of the plane. Accordingly, in some embodiments, the asymmetrical source/drain feature 246 may extend differently toward different sides/directions but along a same axis (e.g., the X axis) that is perpendicular to the channel direction (e.g., the Y axis).

In some embodiments, the asymmetrical source/drain feature 246 may be epitaxially grown using a low-pressure chemical vapor deposition (LPCVD) process and/or a metal-organic chemical vapor deposition (MOCVD) process. In some embodiments, the asymmetrical source/drain feature 246 may be formed of silicon-containing material such as, for example, silicon phosphorus (SiP) for N-type FinFET's or silicon germanium (SiGe) for P-type FinFET's.

Although the cross-section of the asymmetrical source/drain feature 246 is shown as a diamond-like shape in FIG. 10B, it is noted that such a shape is provided merely for illustration purposes. As long as the asymmetrical source/drain feature 246 is formed to have asymmetrical right and left portions according to where the constraint structure 236' is formed, the asymmetrical source/drain feature 246 can be formed as any desired shape (e.g., a pentagon, a hexagon, an octagon, etc.) while remaining within the scope of the present disclosure.

When a conventional FinFET's source/drain feature is formed, no such a constraint structure 236' is present. Accordingly, the conventional source/drain feature may be symmetrically formed. As such, when two FinFET's are designed to be formed substantially close to each other, the respective source/drain features that each symmetrically extends toward left and right sides may be even closer, if not merging, which may disadvantageously cause various issues, for example, a high parasitic capacitance formed between such two neighboring FinFET's, a short circuit formed between the two FinFET's, etc. In contrast, the disclosed constraint structure 236' disposed, for example, at the right side of the left fin 212, and/or at the left side of the right fin 212, before the formation of respective asymmetrical source/drain features 246 can prevent such issues.

Figure 11A:
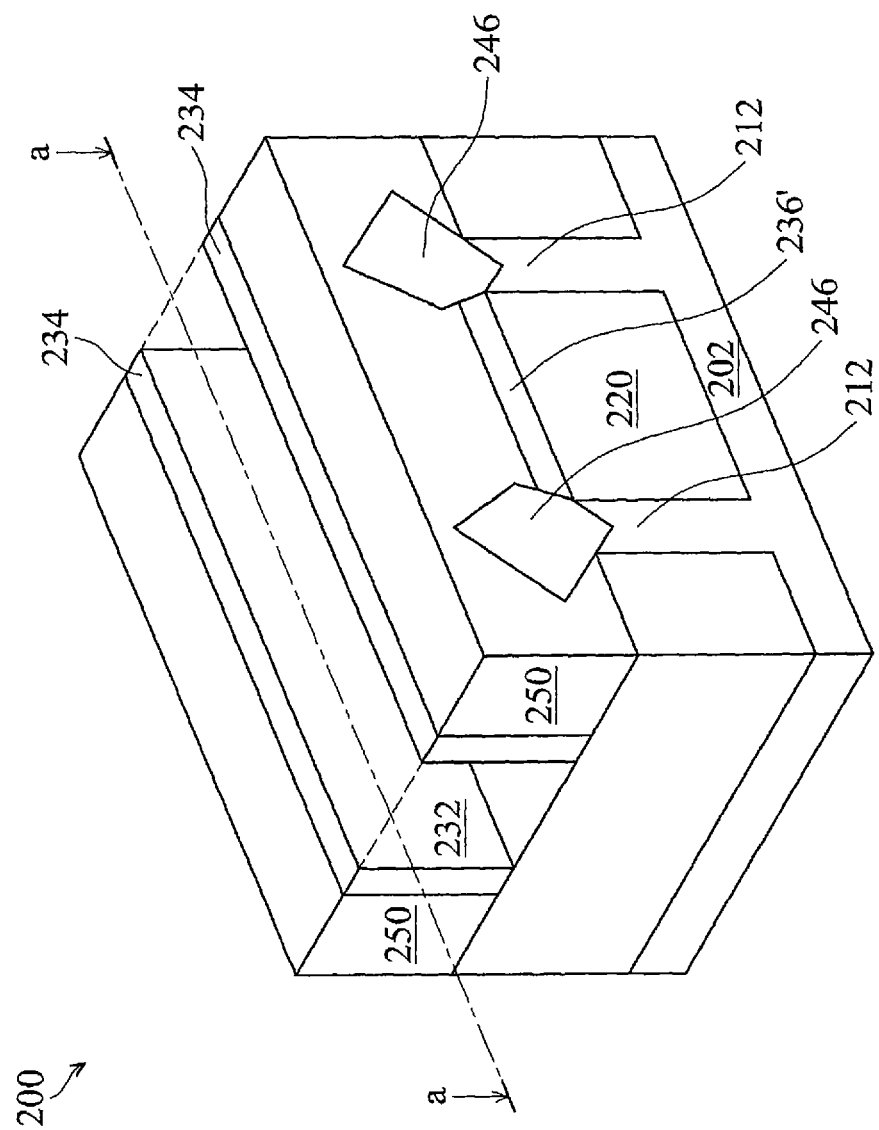
Figure 11B:
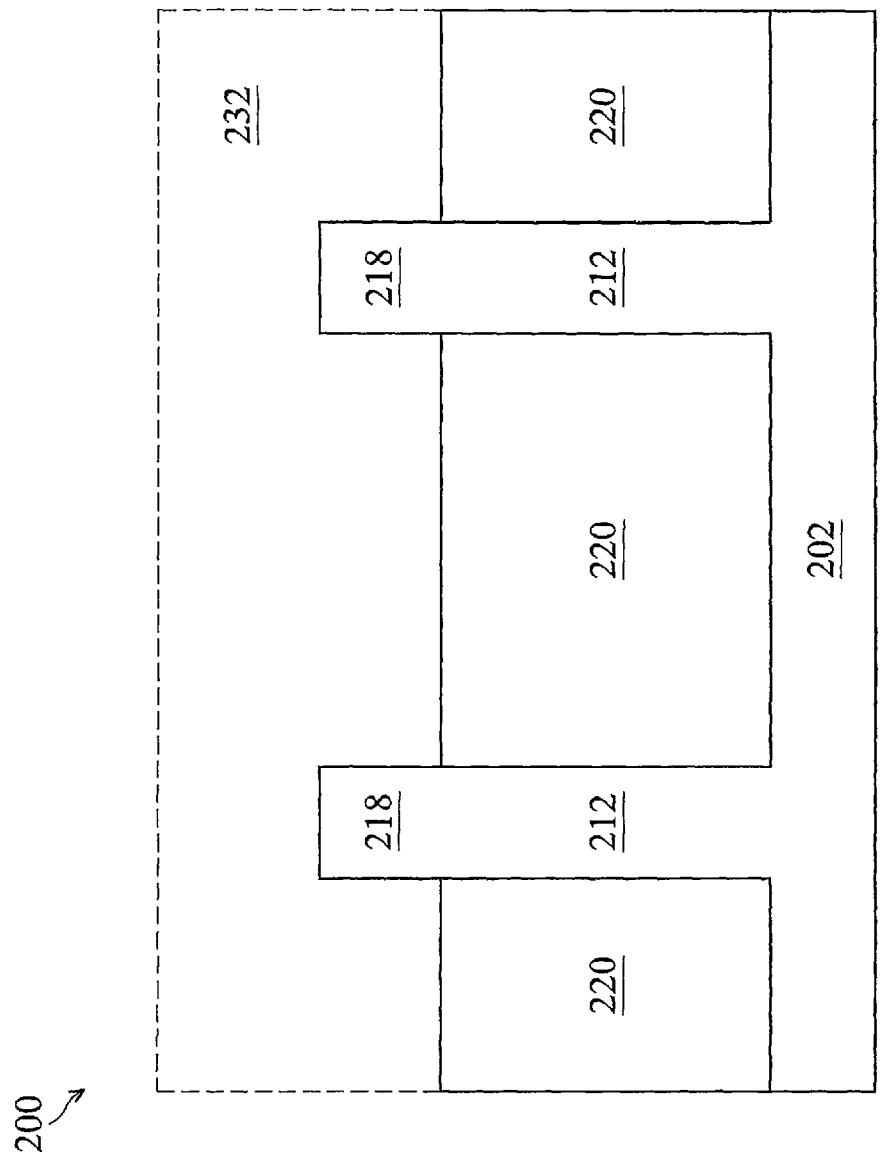

Corresponding to the operation 120 of FIG. 1A, FIG. 11A is a perspective view of the FinFET 200 with the dummy gate electrode 232 removed at one of the various stages of fabrication, according to some embodiments, and FIG. 11B is a cross-sectional view of the FinFET 200 taken along line a-a of FIG. 11A. For purposes of illustration, the removed dummy gate electrode 232 is shown in dotted line. As shown, after the dummy gate electrode 232 is removed, the central portions of the upper fins 218 (that was overlaid by the dummy gate electrode 232) are exposed, respectively.

In some embodiments, prior to the dummy gate electrode 232 being removed, a dielectric layer 250 may be formed over the asymmetrical source/drain features 246 to protect them. Such a dielectric layer 250 may include a material that is selected from at least one of: silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Further, in some embodiments, concurrently with or subsequently to the dummy gate electrode 232 being removed, the spacer layer 234 may remain intact. In the example in which the dummy gate electrode 232 includes a polysilicon material, the dummy gate electrode 232 may be removed (etched) by one or more selective dry and/or wet etching processes until the central portion of the upper fin 218 that was covered by the dummy gate electrode 232 is exposed. More specifically, in some embodiments, the wet etching process includes using diluted hydrofluoric acid (DHF), and/or an amine derivative etchant (e.g., $NH_4OH$, $NH_3(CH_3)OH$, TetraMethyl Ammonium Hydroxide (TMAH), etc.); and the dry etching process includes using a plasma of reactive gas that is selected from: fluorocarbons, oxygen, chlorine, boron trichloride, nitrogen, argon, helium, or a combination thereof.

Figure 12A:
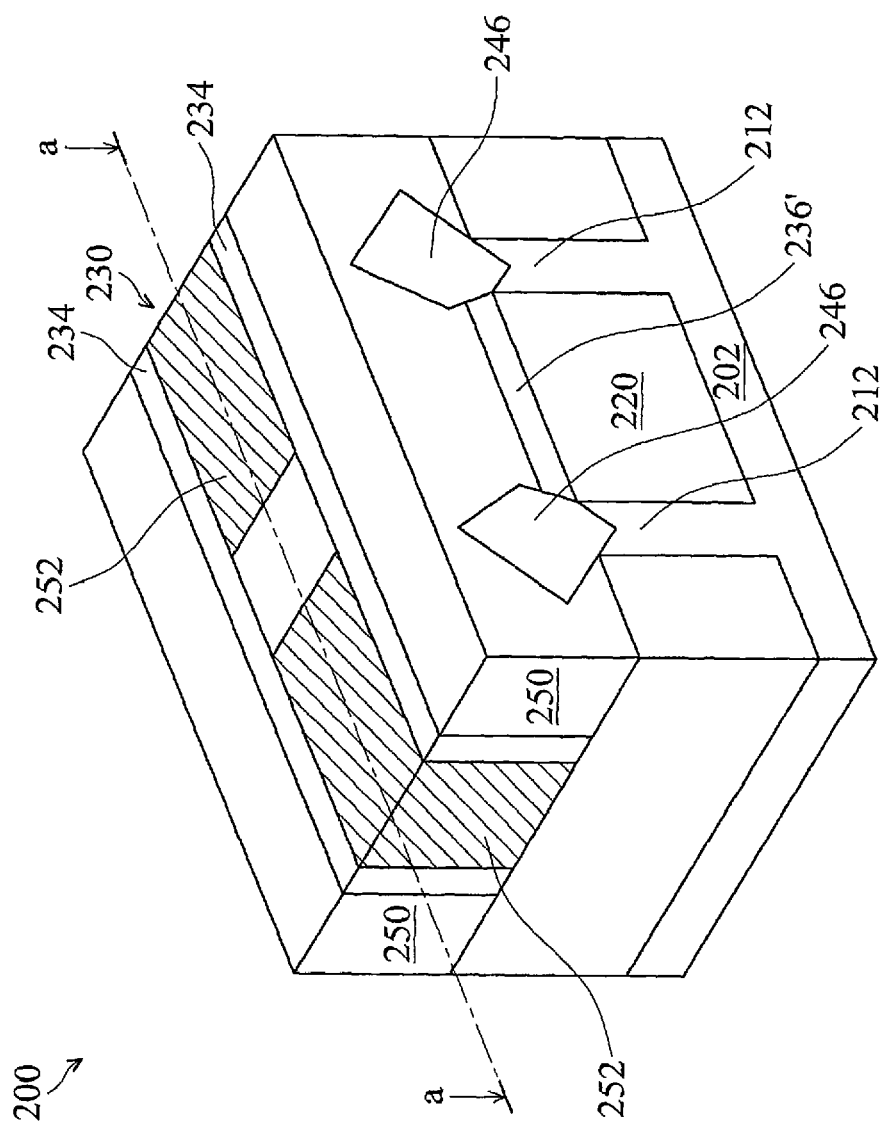
Figure 12:
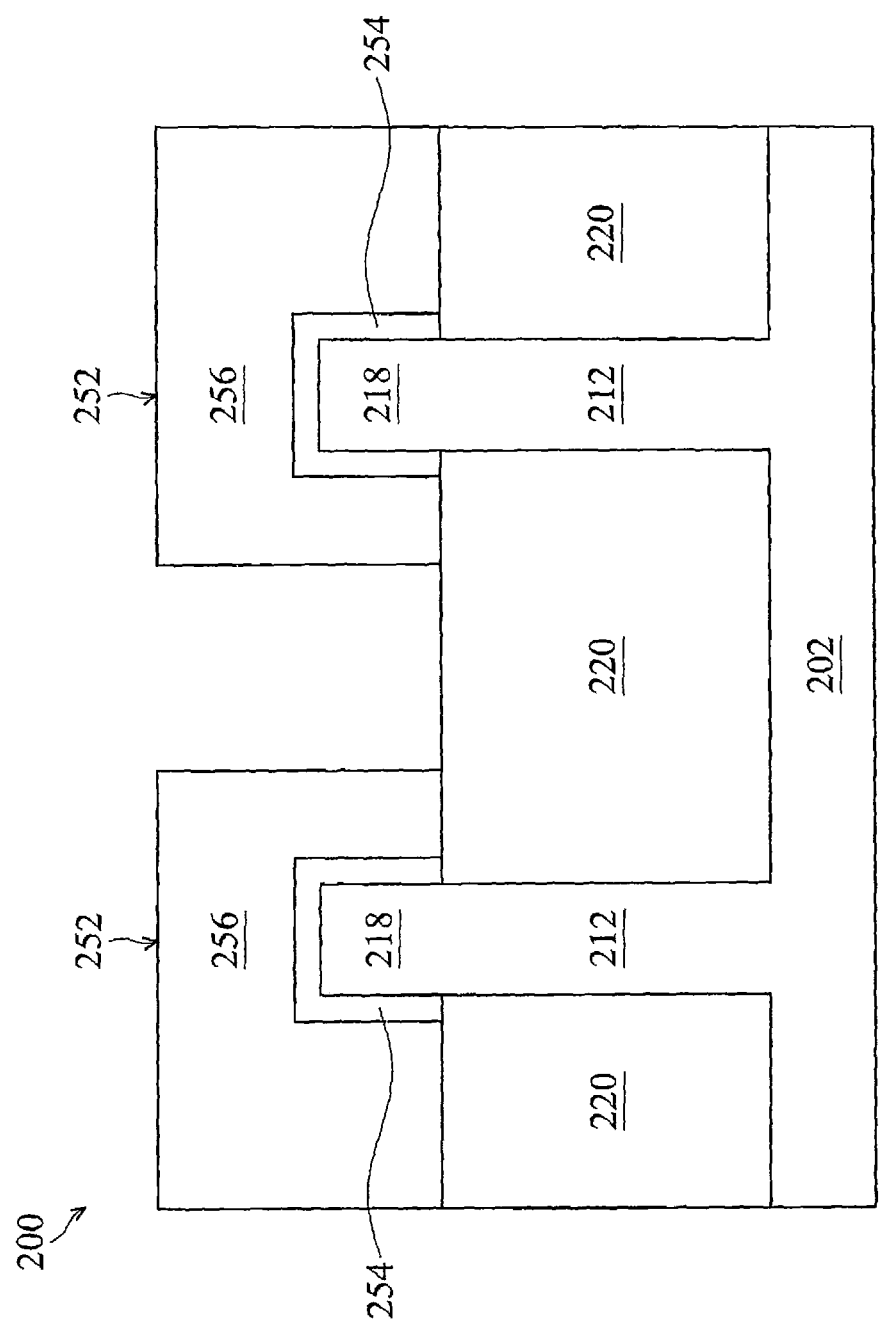

Corresponding to the operation 122 of FIG. 1A, FIG. 12A is a perspective view of the FinFET 200 including one or more gate features 252 formed over the respective exposed portions (i.e., the respective central portions) of the upper fins 218 at one of the various stages of fabrication, according to some embodiments, and FIG. 12B is a cross-sectional view of the FinFET 200 taken along line a-a of FIG. 12A. In some embodiments, the gate feature 252 may include a gate dielectric layer 254 and a conductive gate electrode 256, as shown in the cross-sectional view of FIG. 12B. More specifically, the central portions of the upper fins 218 are each overlaid by the respective conductive gate electrode 256 with the respective gate dielectric layer 254 sandwiched therebetween. Although the conductive gate electrodes 256 are formed as two separate layers to overlay the left and right upper fins 218, respectively, it is noted that the conductive gate electrodes 256 may be together formed as a single layer to overlay both the left and right upper fins 218 while remaining within the scope of the present disclosure.

In some embodiments, the gate dielectric layer 254 may be formed of a high-k dielectric material. Such a high-k dielectric material may have a "k" value greater than about 4.0, or even greater than about 7.0. In such embodiments, the high-k dielectric layer 254 may be formed of at least one material selected from: $Al_2O_3$, HfAlO, HfAlON, AlZrO, $HfO_2$, $HfSiO_x$, $HfAlO_x$, $HfaSiO_x$, HfSiON, $LaAlO_3$, $ZrO_2$, or a combination thereof. The high-k dielectric layer 254 may be formed using a suitable process such as ALD, CVD, PVD, plating, or combinations thereof.

In some embodiments, the conductive gate electrode 256 may include a metal material such as, for example, Al, Cu, W, Ti, Ta, TiN, TiAl, TiAlN, TaN, NiSi, CoSi, or combinations thereof. In some alternative embodiments, the conductive gate electrode 256 may include a polysilicon material, wherein the polysilicon material may be doped with a uniform or non-uniform doping concentration. The conductive gate electrode 256 may be formed using a suitable process such as ALD, CVD, PVD, plating, or combinations thereof.

Figure 13:
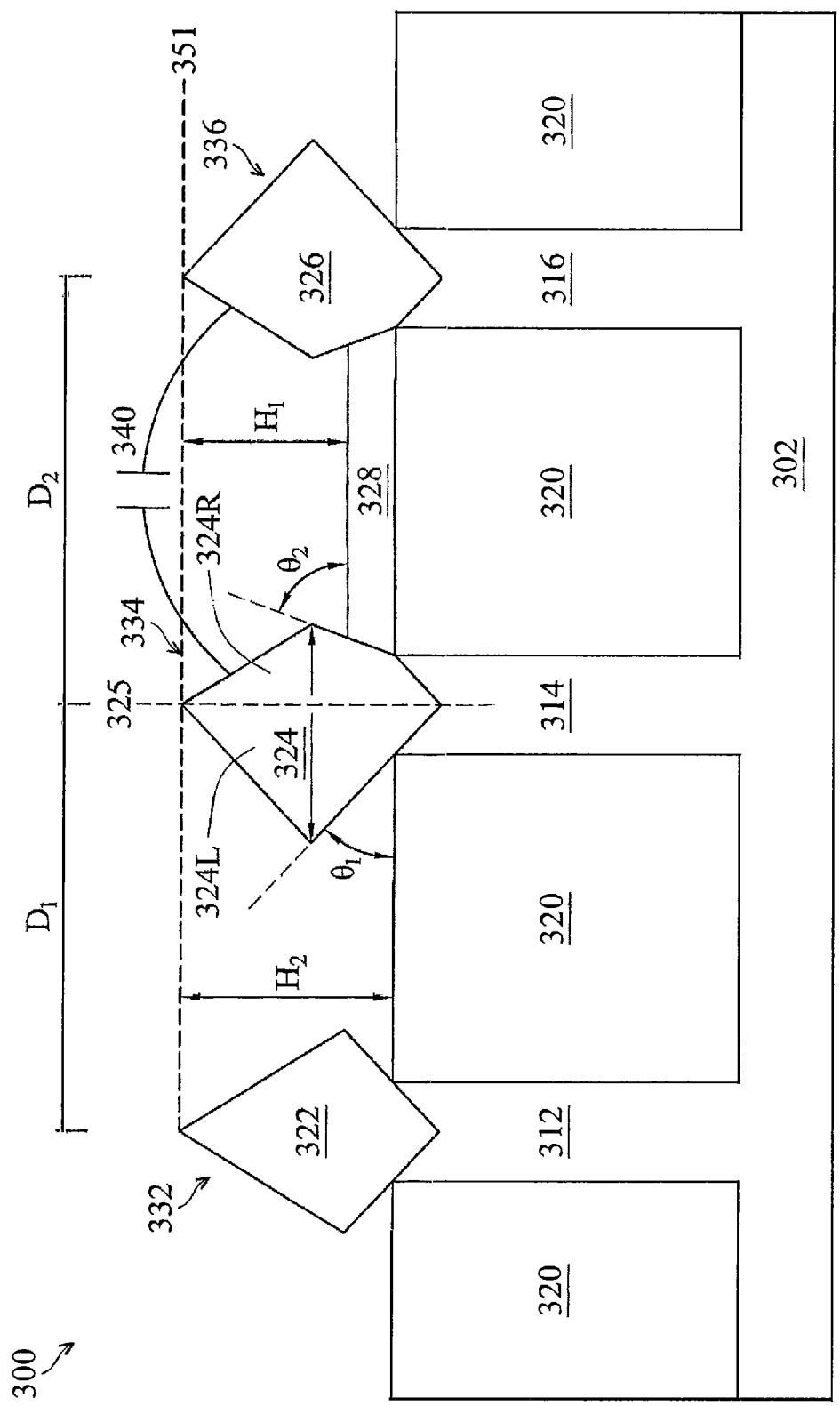
FIG. 13 illustrates a cross-sectional view of a portion of a semiconductor device, made by the method of FIGS. 1A-1B, in accordance with some embodiments.

FIG. 13 illustrates a cross-sectional view of a portion of a semiconductor device 300 that is formed by the method 100 of FIG. 1, in accordance with some embodiments. In some embodiments, the semiconductor device 300 may be a multi-transistor static random access memory (SRAM) device (e.g., a 6-transistor SRAM device, an 8-transistor SRAM device, etc.), which includes respective pluralities of n-type MOSFETs and p-type MOSFETs connected to one another to suitably perform read/write functions. It is noted that the semiconductor device 300 is substantially similar to the semiconductor device 200 so that the semiconductor device 300 will be briefly described as follows.

As shown in FIG. 13, the semiconductor device 300 includes a substrate 302, plural fins 312, 314, and 316 formed over the substrate 302, plural isolation features 320 disposed between the fins 312, plural source/drain features 322, 324, 326 formed over respective fins, and a constraint structure 328 formed between the source/drain features 324 and 326. In some embodiments, the fin 312 and source/drain feature 322 may form a portion of a first n-type MOSFET 332 of the above-mentioned SRAM device; the fin 314 and source/drain feature 324 may form a portion of a second n-type MOSFET 334 of the above-mentioned SRAM device; and the fin 316 and source/drain feature 326 may form a portion of a p-type MOSFET 336 of the above-mentioned SRAM device. When designing such an SRAM device, neighboring MOSFETs that have opposite polarities, e.g., n-type and p-type MOSFETS 334 and 336, may be laid out to be arranged with a relatively short distance $D_2$, while neighboring MOSFETs that have a same polarity, e.g., n-type MOSFETS 332 and 334, may be laid out to be arranged with a relatively long distance $D_1$. As mentioned above, the constraint structure 328, which is similar to the above-described constraint structure 236', is configured to guide corresponding source/drain features to grow asymmetrically (e.g., having two portions that extend toward different sides with respective different widths) so as to reduce the parasitic capacitance induced therebetween. In some embodiments, because of the relatively short distance between the n-type and p-type MOSFETS 334 and 336, the constraint structure 328, formed between such two neighboring MOSFETs 334 and 336, can allow parasitic capacitance 340, induced between the respective source/drain features 324 and 326 of the MOSFETs 334 and 336, to be substantially reduced.

In an example where the SRAM device has a pitch of about 300~320 nm, the distance $D_2$ between the MOSFETs 332 and 334 is about 15~30 nm and the distance $D_1$ between the MOSFETs 334 and 336 is about 65~80 nm. As such, with the constraint structure 328 having a thickness of about 8~12 nm, each of the source/drain features can have an asymmetric profile that horizontally extends toward opposite sides by respective different widths. Using the source/drain feature 324 as a representative example, the source/drain feature 324 has a first portion extending toward a first side where the constraint structure 328 is not formed by width 324L of about 12~22 nm, which forms a first angle $\theta_1$ titled from a horizontal boundary that is about 55°~66°, and a second portion extending toward a second side where the constraint structure 328 is formed by width 324R of about 10~20 nm, which forms a second angle $\theta_2$ titled from a horizontal boundary that is about 58°~72°. In some embodiments, the width 324R is substantially shorter than the width 324L thereby causing the second angle $\theta_2$ to be substantially greater than the first angle $\theta_1$. In some embodiments, with the constraint structure 328 formed on the isolation feature 320 between the source/drain features 324 and 326, a height $H_1$, measuring from the top boundary of the constraint structure 328 to a common symbolic boundary 351, may be produced to be lower than a height $H_2$, measuring from the top boundary of the isolation feature 320 to the common symbolic boundary 351. For example, the height $H_1$ may be about 30~60 nm, and the height $H_2$ may be about 50~80 nm. Further, in some embodiments, at least one of the fins 312 to 316 may be formed to include two laterally separated fins that are overlaid by respective source/drain features. Such two laterally separated fins may have a distance of about 30~40 nm therebetween. As such, the top boundary of such a fin that includes two laterally separated fins may produce a height of about 30~80 nm (measuring from the top boundary of the fin to the common symbolic boundary 351).

In an embodiment, a semiconductor device is disclosed. The semiconductor device includes a fin-like structure extending along a first axis; and a first source/drain feature disposed at a first end portion of the fin-like structure. In some embodiments, the first source/drain feature comprises an asymmetrical cross-section that extends differently toward respective opposite directions along a second axis.

In another embodiment, a semiconductor device includes a first fin-like structure extending along a first axis; a second fin-like structure extending along the first axis; a first source/drain feature disposed at one end of the first fin-like structure; and a second source/drain feature disposed at one end of the second fin-like structure, wherein the second source/drain feature is adjacent to the first source/drain feature; wherein the first source/drain feature comprises a first portion comprising a shorter extended width along a second axis and a second portion comprising a longer extended width along the second axis, and the second source/drain feature comprises a third portion comprising a shorter extended width along the second axis and a fourth portion comprising a longer extended width along the second axis, and wherein the first and third portions extend toward each other, and the second and fourth portions extend apart from each other.

Yet in another embodiment, a method for forming a fin-based transistor includes: forming a fin on a substrate; overlaying at least an upper central portion of the fin by a dummy gate stack; forming a constraint layer at a first side of an end portion of the fin; and using the constraint layer to guide a formation of a source/drain feature, wherein the source/drain feature has an asymmetrical cross-section that extends differently toward respective opposite directions.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin-based transistor, comprising:
    forming a fin on a substrate;
    overlaying at least an upper central portion of the fin by a dummy gate stack;
    forming a constraint layer at a first side of an end portion of the fin; and
    using the constraint layer to guide a formation of a source/drain feature, wherein the source/drain feature has an asymmetrical cross-section that extends differently toward respective opposite directions.

2. The method of claim 1, wherein the source/drain feature comprises:
    a first portion extending toward the first side and a second portion extending toward a second side opposite to the first side thereby causing a first angle formed between a horizontal boundary and a boundary of the first portion is substantially greater than a second angle formed between the horizontal boundary and a boundary of the second portion.

3. The method of claim 1, wherein the formation of the source/drain feature comprises:
    etching the end portion of the fin to form a recessed portion of the fin; and
    epitaxially growing the source/drain feature from the recessed portion of the fin.

4. The method of claim 1, further comprising:
    removing at least part of the dummy gate stack thereby exposing the upper central portion of the fin;
    forming a gate dielectric layer over the upper central portion of the fin; and
    forming a metal gate electrode over the gate dielectric layer.

5. The method of claim 1, wherein the formation of the constraint layer comprises:
    forming a blanket constraint layer at the first side of the end portion of the fin;
    etching a portion of the blanket constraint layer while etching the end portion of the fin to form a recessed portion of the fin.

6. The method of claim 1, wherein the fin extends along a first axis, and the asymmetrical cross-section extends along a second axis that is perpendicular to the first axis.

7. A method of forming a semiconductor device, comprising:
    providing a semiconductor substrate;
    forming one or more fins extending beyond a major surface of the semiconductor substrate;
    depositing a dielectric material over the semiconductor substrate;
    exposing respective top surfaces of the one or more fins;
    exposing an upper portion of the one or more fins;
    forming a dummy gate stack over respective central portions of the upper portion of the one or more fins so as expose respective side portions of the upper portion;
    forming a constraint structure over the respective side portions of the upper portion; and
    growing an asymmetrical source/drain feature above each of the one or more fins, wherein the asymmetrical source/drain features is guided by the constraint structure to grow toward a side where the constraint structure is not formed.

8. The method of claim 7, further comprising removing at least part of the dummy gate stack to expose the respective central portions of the upper portion.

9. The method of claim 8 further comprising forming a gate feature over the central portion of each upper portion.

10. The method of claim 7, wherein forming the one or more fins comprises forming a photo-sensitive layer over the substrate, wherein the photo-sensitive layer is patterned with one or more holes to form the one or more fins, respectively.

11. The method of claim 10, further comprising:
    forming a pad layer on a top surface of the substrate; and
    forming a mask layer on a top surface of the pad layer, wherein the photo-sensitive layer is formed on a top surface of the mask layer.

12. The method of claim 11, wherein the pad layer provides an adhesion layer between the semiconductor substrate and the mask layer.

13. The method of claim 11, wherein the pad layer provides an etch stop layer while etching the mask layer.

14. The method of claim 11, wherein the mask layer is formed of silicon nitride and provides a hard mask during a photolithography processes.

15. The method of claim 7, wherein forming the constraint structure comprises:
    forming a constraint layer over respective side portions of the upper portion of the one or more fins; and
    recessing the constraint layer and the respective side portions of the upper portion to form the constraint structure.

16. A method of forming a semiconductor device, comprising:
   providing a semiconductor substrate;
   forming a fin extending beyond a major surface of the semiconductor substrate;
   forming a constraint structure adjacent to a side portion of an upper portion of the fin; and
   growing an asymmetrical source/drain feature above the fin, wherein the asymmetrical source/drain features is guided by the constraint structure to grow toward a side where the constraint structure is not formed.

17. The method of claim 16, further comprising:
   depositing a dielectric material over the semiconductor substrate;
   exposing a top surface of the fin;
   exposing the upper portion of the fin; and
   forming a dummy gate stack over a central portion of the upper portion of the fins so as expose the side portions of the upper portion.

18. The method of claim 17, further comprising removing at least part of the dummy gate stack to expose the central portion of the upper portion of the fin.

19. The method of claim 18 further comprising forming a gate feature over the central portion of each upper portion of the fin.

20. The method of claim 16, wherein forming the constraint structure comprises:
   forming a constraint layer over the side portion of the upper portion of the fin; and
   recessing the constraint layer and the side portion of the upper portion to form the constraint structure.

\* \* \* \* \*